United States Patent
Kuo et al.

(10) Patent No.: US 11,515,224 B2
(45) Date of Patent: Nov. 29, 2022

(54) PACKAGES WITH ENLARGED THROUGH-VIAS IN ENCAPSULANT

(71) Applicant: Taiwan Semiconductor Manufacturing Company, Ltd., Hsinchu (TW)

(72) Inventors: Hung-Jui Kuo, Hsinchu (TW); Tai-Min Chang, Taipei (TW); Hui-Jung Tsai, Hsinchu (TW); De-Yuan Lu, Taipei (TW); Ming-Tan Lee, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/745,527

(22) Filed: Jan. 17, 2020

(65) Prior Publication Data
US 2021/0225722 A1    Jul. 22, 2021

(51) Int. Cl.
*H01L 23/31* (2006.01)
*H01L 23/00* (2006.01)
*H01L 23/48* (2006.01)
*H01L 21/56* (2006.01)

(52) U.S. Cl.
CPC ........ *H01L 23/3121* (2013.01); *H01L 21/561* (2013.01); *H01L 23/3114* (2013.01); *H01L 23/481* (2013.01); *H01L 24/03* (2013.01); *H01L 2224/0233* (2013.01)

(58) Field of Classification Search
None
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,318,442 B1 | 4/2016 | Chen |
| 10,505,255 B2 | 12/2019 | Baheti et al. |
| 10,720,409 B2 | 7/2020 | Yu et al. |

(Continued)

FOREIGN PATENT DOCUMENTS

| | | |
|---|---|---|
| JP | 2017069485 A | 4/2017 |
| KR | 20160037805 A | 4/2016 |

(Continued)

*Primary Examiner* — Jay C Chang
(74) *Attorney, Agent, or Firm* — Slater Matsil, LLP

(57) ABSTRACT

A package includes a device die, an encapsulant encapsulating the device die therein, a first plurality of through-vias penetrating through the encapsulant, a second plurality of through-vias penetrating through the encapsulant, and redistribution lines over and electrically coupling to the first plurality of through-vias. The first plurality of through-vias include an array. The second plurality of through-vias are outside of the first array, and the second plurality of through-vias are larger than the first plurality of through-vias.

20 Claims, 38 Drawing Sheets

(56) References Cited

U.S. PATENT DOCUMENTS

| | | | |
|---|---|---|---|
| 2011/0068481 A1* | 3/2011 | Park | H01L 25/0657 |
| | | | 257/777 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0371947 A1* | 12/2015 | Chen | H01L 21/76898 |
| | | | 257/774 |
| 2016/0300773 A1* | 10/2016 | Lee | H01L 23/3121 |
| 2017/0141056 A1* | 5/2017 | Huang | H01L 24/19 |
| 2018/0053746 A1* | 2/2018 | Yu | H01L 24/97 |
| 2019/0341360 A1 | 11/2019 | Yu et al. | |

FOREIGN PATENT DOCUMENTS

| | | |
|---|---|---|
| KR | 20180089302 A | 8/2018 |
| TW | 201826466 A | 7/2018 |

\* cited by examiner

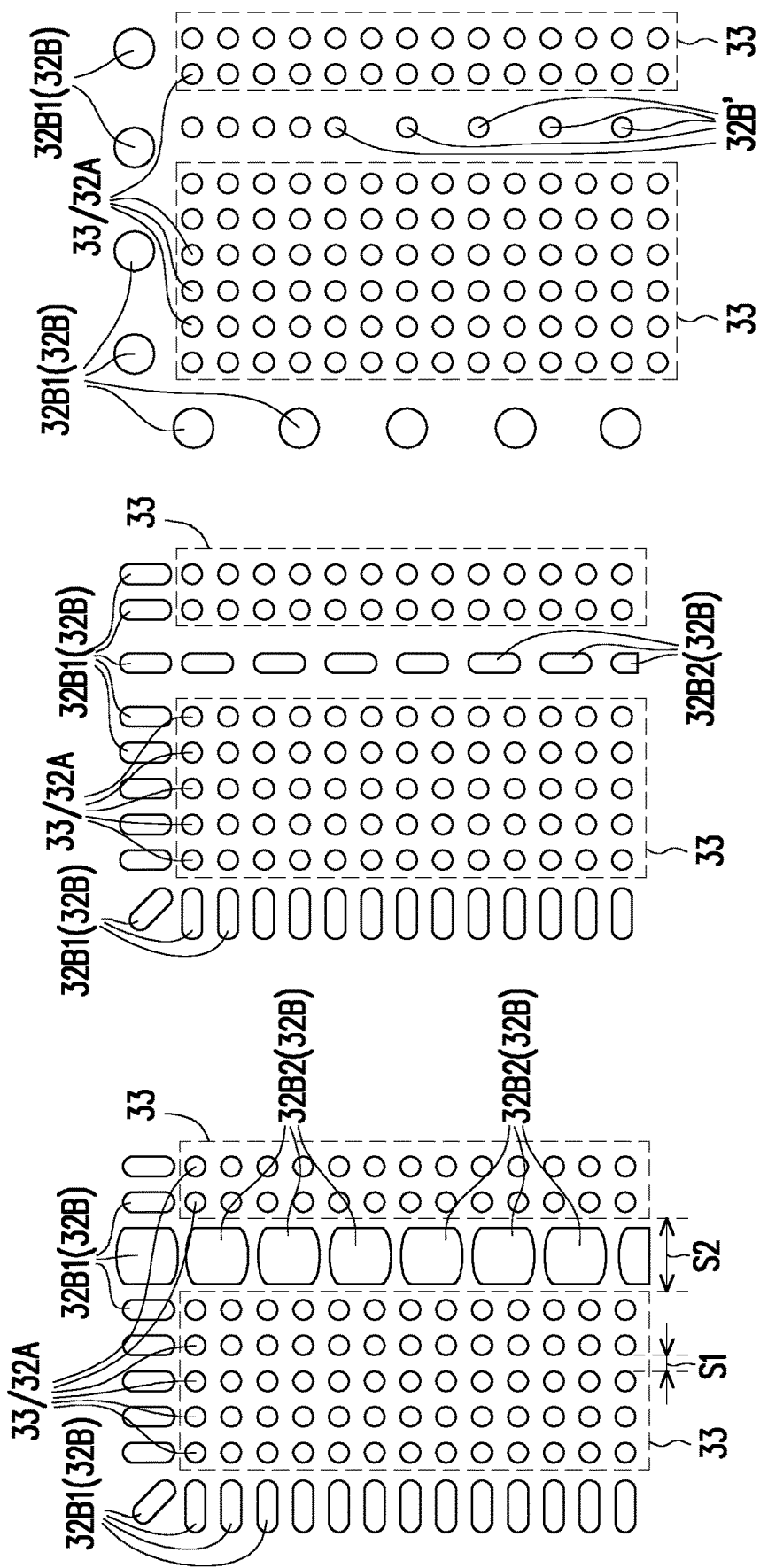

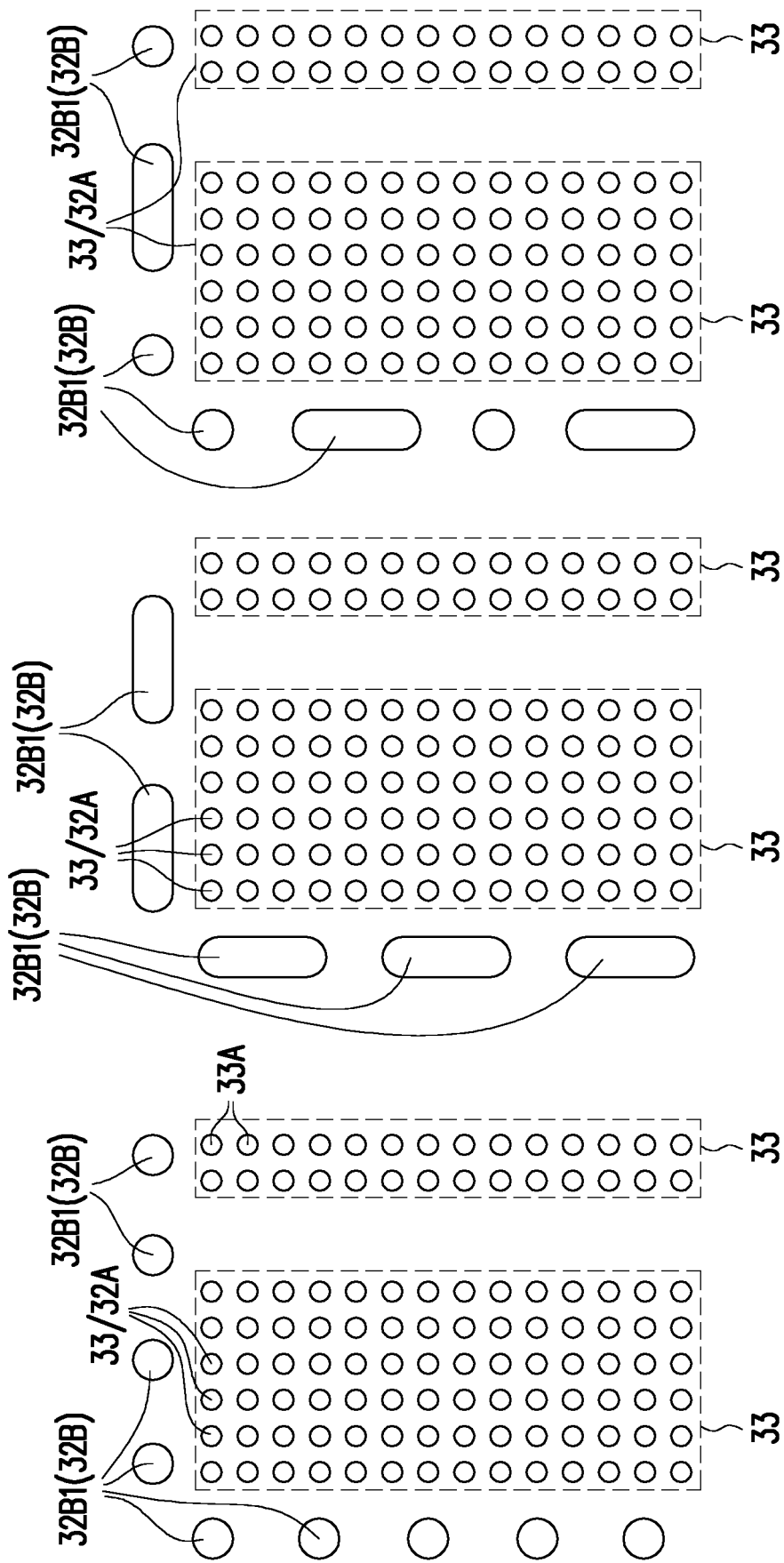

PACKAGES WITH ENLARGED THROUGH-VIAS IN ENCAPSULANT

BACKGROUND

With the evolving of semiconductor technologies, more functions need to be integrated into semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

The fan-out packages include device dies molded in molding compound. Through-vias may be formed in the device dies to interconnect the features on the opposite sides of the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 34 through 53 illustrate the top views of through-vias, enlarged through-vias, and dummy through-vias in accordance with some embodiments.

DETAILED DESCRIPTION

Figure 1:
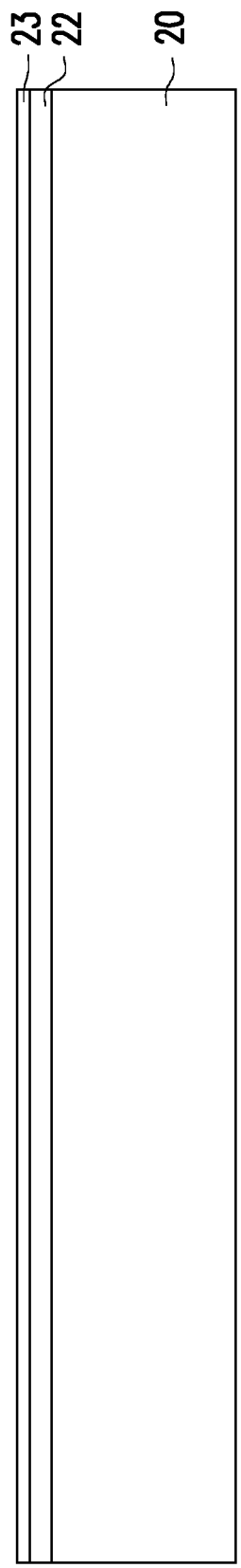
FIGS. 1 through 18 illustrate the cross-sectional views of intermediate stages in the formation of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package, which may be an Integrated Fan-Out (InFO) Package, and the method of forming the same are provided in accordance with some embodiments. The intermediate stages in the formation of the InFO package are illustrated in accordance with some embodiments. Some variations of some embodiments are discussed. Throughout the various views and illustrative embodiments, like reference numbers are used to designate like elements. Although method embodiments may be discussed as being performed in a particular order, other method embodiments may be performed in any logical order. In accordance with some embodiments of the present disclosure, through-vias a formed, and are encapsulated along with device dies in an encapsulant. The through-vias may be formed as arrays. Throughout the description, when the term "array" is used, it also includes any other repeated patterns that have uniform densities, for example, the beehive pattern. On the outer sides of the arrays of the through-vias, enlarged through-vias are formed to reduce the through-via tilting/peeling caused by the force applied on the through-vias when plating mask is removed.

Figure 58:
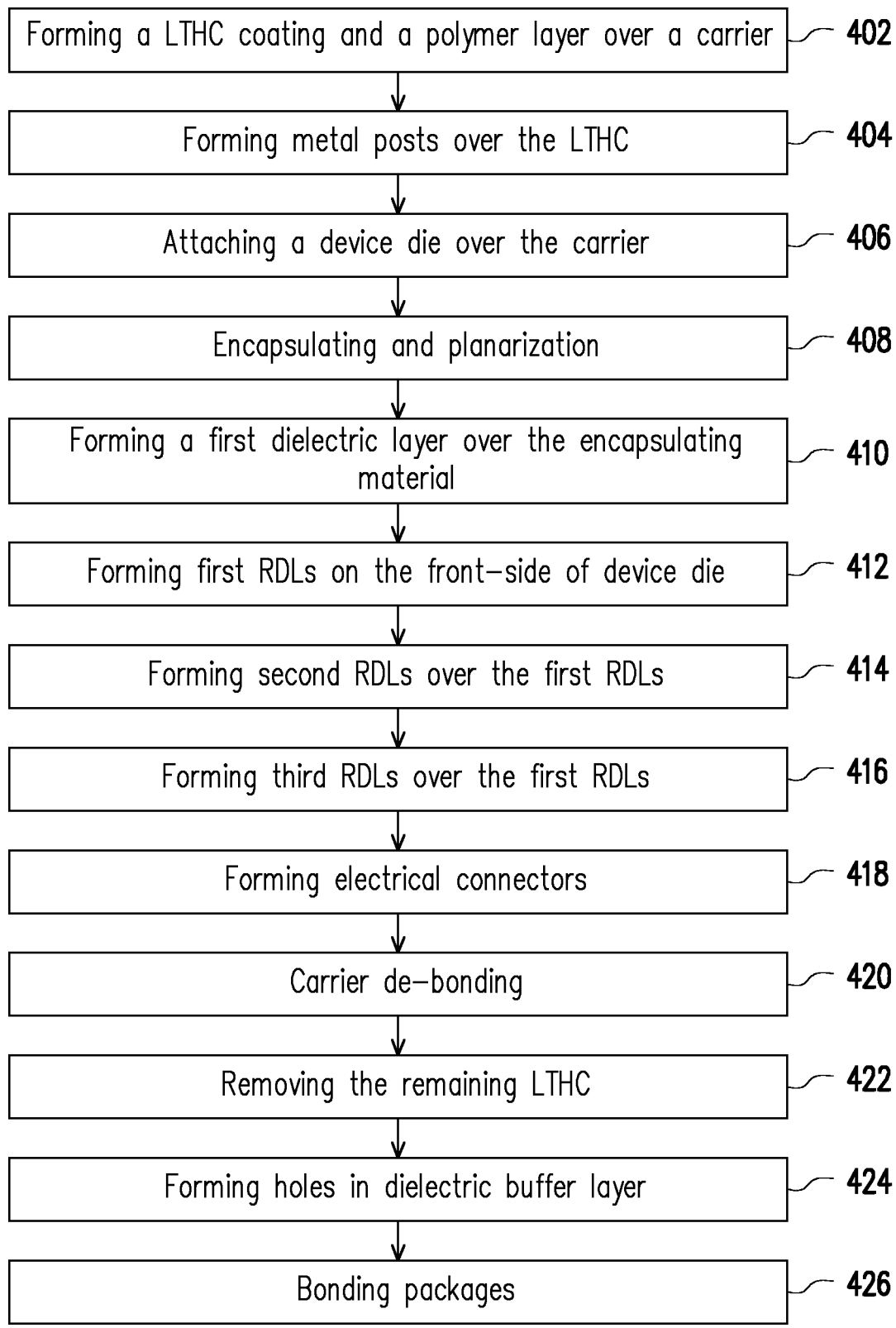
FIG. 58 illustrates a process flow for forming a package in accordance with some embodiments.

FIGS. 1 through 18 illustrate the cross-sectional views of intermediate stages in the formation of a package in accordance with some embodiments of the present disclosure. The corresponding processes are also reflected schematically in the process flow 400 shown in FIG. 58. Referring to FIG. 1, carrier 20 is provided, and release film 22 is coated on carrier 20. Carrier 20 is formed of a transparent material, and may be a glass carrier, a ceramic carrier, an organic carrier, or the like. Carrier 20 may have a round top-view shape, and may have a size of a silicon wafer. Release film 22 is in physical contact with the top surface of carrier 20, and may be formed through coating. Release film 22 may be formed of a Light-To-Heat-Conversion (LTHC) material. In accordance with some embodiments of the present disclosure, the LTHC coating material is capable of being decomposed under the heat of light/radiation (such as a laser beam), and hence can release carrier 20 from the structure formed thereon.

In accordance with some embodiments, as also shown in FIG. 1, polymer buffer layer 23 is formed on LTHC coating material 22. The processes for forming release film 22 and polymer buffer layer 23 are illustrated as process 402 in the process flow shown in FIG. 58. In accordance with some embodiments, polymer buffer layer 23 is formed of polybenzoxazole (PBO), polyimide, benzocyclobutene (BCB), or another applicable polymer.

Figure 2:
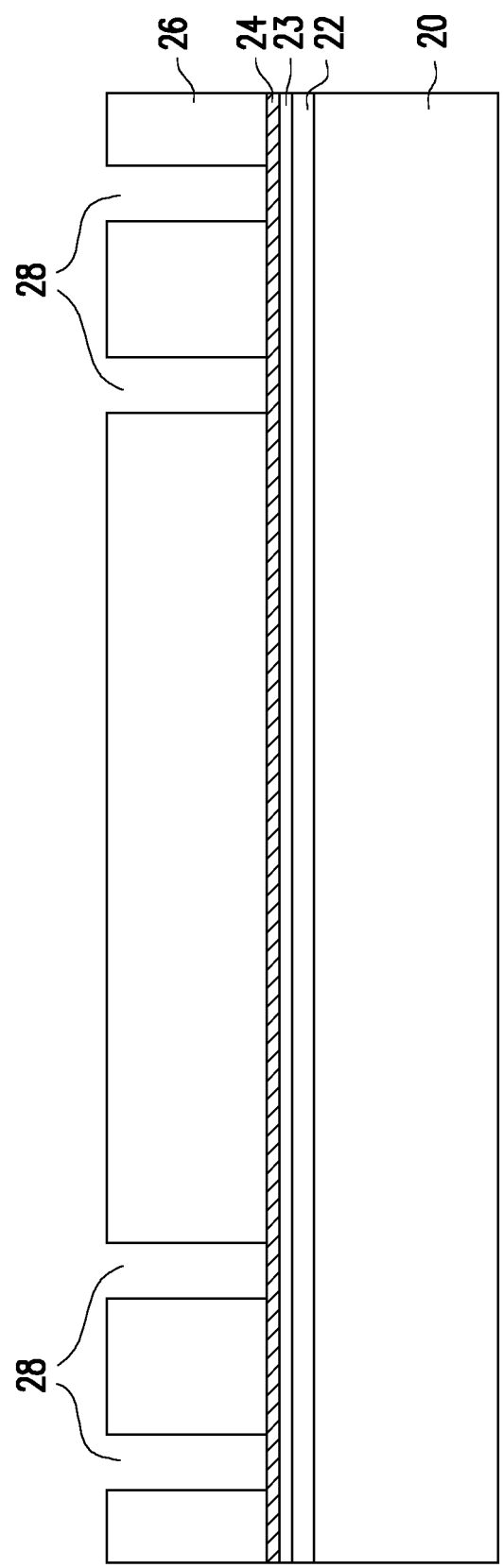
Figure 3:
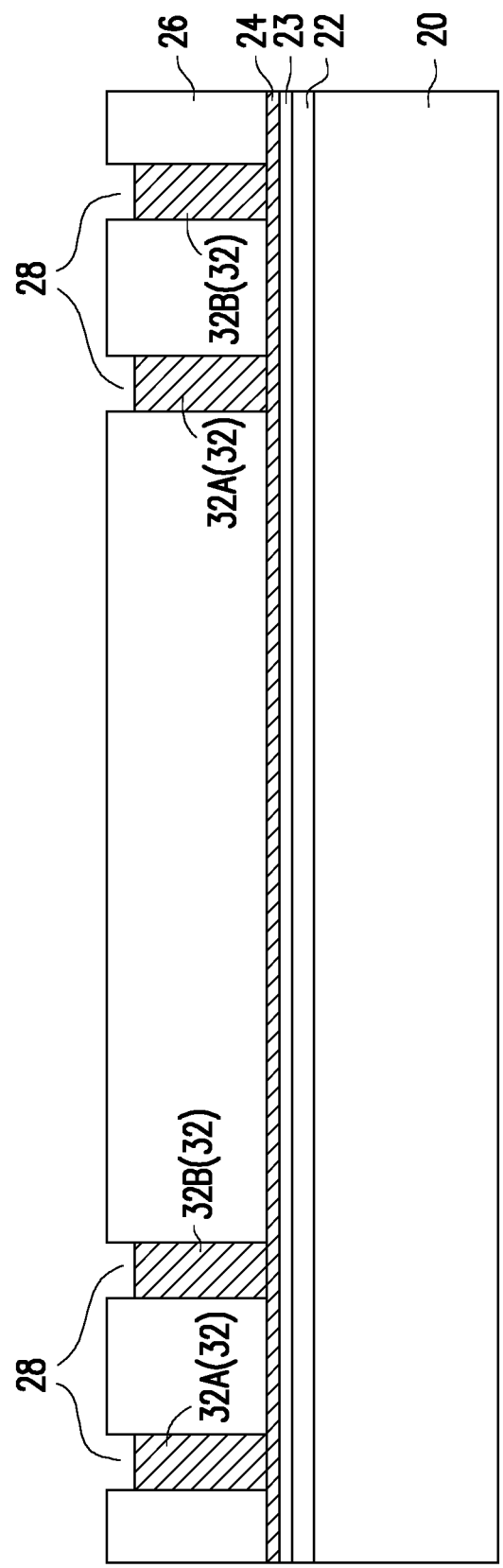
Figure 4:
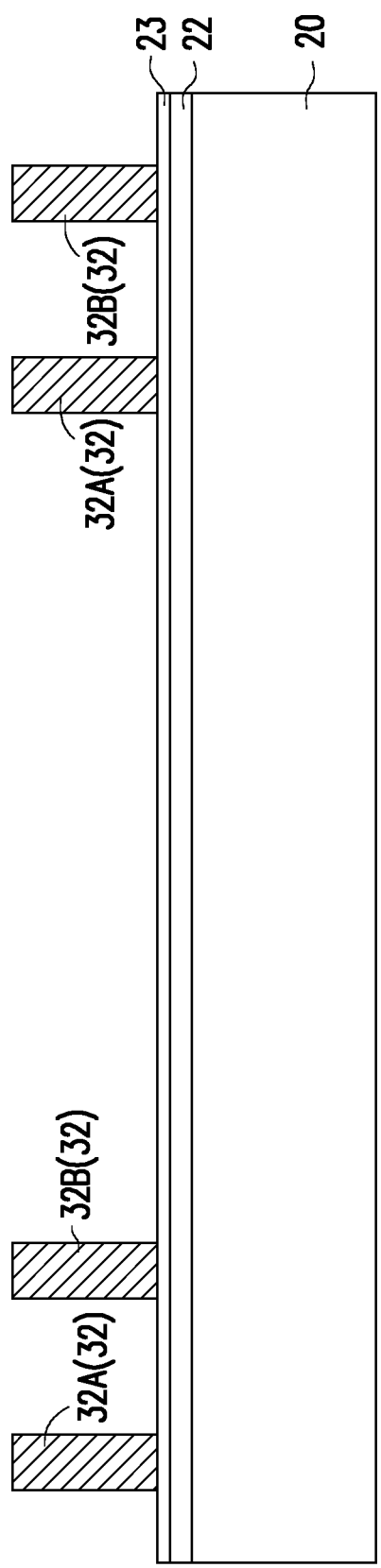

FIGS. 2 through 4 illustrate the formation of metal posts 32, which include metal posts 32A and enlarged metal posts 32B. The respective process is illustrated as process 404 in the process flow shown in FIG. 58. Referring to FIG. 2, metal seed layer 24 is formed, for example, through Physical Vapor Deposition (PVD). Metal seed layer 24 may be in physical contact with polymer buffer layer 23. In accordance with some embodiments of the present disclosure, metal seed layer 24 includes a titanium layer and a copper layer over the titanium layer.

Plating mask 26 is formed over metal seed layer 24. In accordance with some embodiments of the present disclosure, plating mask 26 is formed of a dry film photo resist, which is laminated on metal seed layer 24. The dry film photo resist may be formed of Ajinomoto Build-up Film (ABF) or the like. In accordance with alternative embodiments, plating mask 26 is formed of a photo resist. Plating mask 26 is patterned in a lithography process, which is performed using a photo lithography mask (not shown), so that openings 28 are formed in plating mask 26. Some portions of metal seed layer 24 are exposed through openings 28.

Next, as shown in FIG. 3, metal posts 32 are formed by plating a metallic material in openings 28. The plated metallic material may be copper or a copper alloy. The top surfaces of metal posts 32 are lower than the top surface of plating mask 26, so that the shapes of metal posts 32 are confined by openings 28. Metal posts 32 may have substantially vertical and straight edges. Metal posts 32 may include metal posts 32A and enlarged metal posts 32B that are larger (in lateral dimensions) than metal posts 32A. The dimensions and shapes of metal posts 32A and enlarged metal posts 32B are discussed in subsequent paragraphs.

In subsequent processes, plating mask 26 is removed, and the underlying portions of metal seed layer 24 are exposed. In accordance with the embodiments in which plating mask 26 is formed of a dry film, plating mask 26 may be removed using a stripping chemical, which may be a chemical solution. For example, the chemical solution may include dimethyl sulfoxide (DMSO), dimethylacetamide (DMAc), N-methyl-2-pyrrolidone (NMP), tetrahydrofuran (THF), N,N-dimethylformamide (DMF), acetonitrile (MeCN), dichloromethane (DCM), monoethanolamine (MEA), monoisopropanolamine (MIPA), AEA, Propylene Glycol (PG), Propylene Glycol Monomethyl Ether (PGME), Ethylene glycol monomethyl ether (EGME), Tetra-methyl ammonium hydroxide (TMAH), and KOH, or may include other chemicals, depending on the type of the dry film. In accordance with the embodiments in which plating mask 26 is formed of photo resist, plating mask 26 may be removed in an ashing process, with the stripping chemical including gases, for example, oxygen ($O_2$). The photo resist may also be removed in a wet stripping process.

Figure 33:
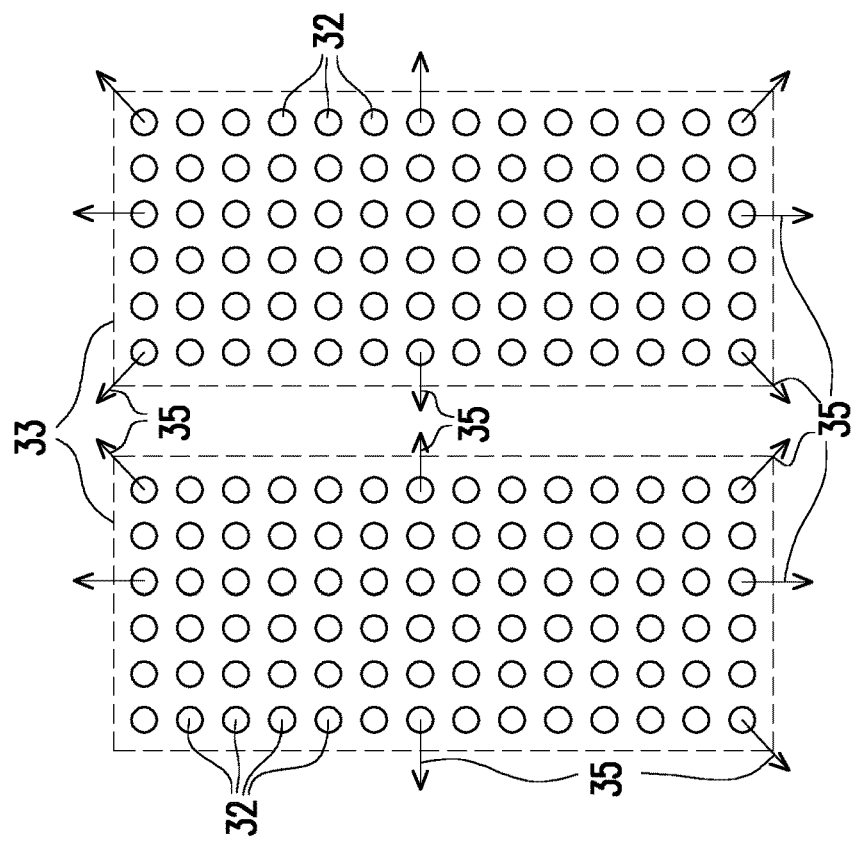
FIGS. 32 and 33 illustrate the top views of arrays of through-vias in accordance with some embodiments.
Figure 32:
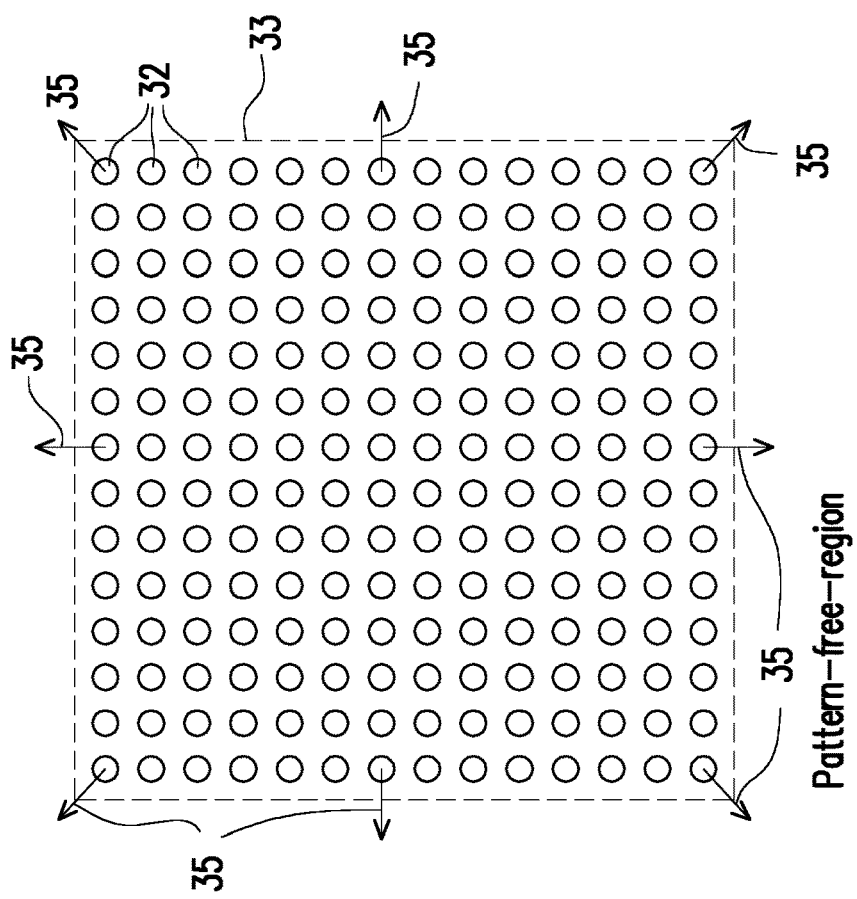

In the removal of the plating mask 26, there may be a force applied on metal posts 32, causing metal posts 32 to tilt, fall, and/or peel, which result in failure of the resulting package. The force may be generated by the swelling of plating mask 26 due to the penetration of the solvent in the stripping chemical into plating mask 26. Plating mask 26 may thus generate a pulling and/or pushing force on metal posts 32. There may be through-via-dense regions, in which the density of metal posts 32 are relatively high, and through-via-sparse or through-via-free regions, in which the density of metal posts 32 are relatively low, or there is no metal post. The metal posts 32 at the boundaries of the through-via-dense regions may tilt toward the neighboring through-via-sparse (or through-via-free) regions. For example, FIG. 32 illustrates an array 33 of metal posts 32 surrounded by a through-via-free region, in which no metal post 32 is formed. In the removal of the plating masks 26, the outmost metal posts 32 of array 33 may tilt or fall in the directions shown by arrows 35. FIG. 33 illustrates metal posts 32 separated into two metal post arrays 33 by a space. Similarly, the outmost metal posts 32 of the arrays 33 may tilt or fall in the direction shown by arrows 35. In accordance with some embodiments of the present disclosure, as will be discussed in subsequent paragraphs, enlarged metal posts are used to have a stronger holding force in order to resist the tilting, falling, and peeling. Also, dummy metal posts may be added to reduce the pattern dense/sparse effect in order to reduce the metal post tilting, falling, and peeling.

Referring back to FIG. 3, after the removal of plating mask 26, the portions of metal seed layer 24 directly underlying the plating mask 26 are revealed. The revealed portions of metal seed layer 24 are then removed in an etching process, for example, in an anisotropic or an isotropic etching process. The edges of the remaining seed layer 24 may be flushed with the respective overlying portions of the plated material. Throughout the description, the remaining portions of metal seed layer 24 are considered as parts of metal posts 32, and are not illustrated separately. The resulting metal posts 32 are illustrated in FIG. 4. The top-view shapes of metal posts 32 include, and are not limited to, circles, rectangles, hexagons, octagons, and the like. After the formation of metal posts 32, polymer buffer layer 23 is exposed.

Figure 5:
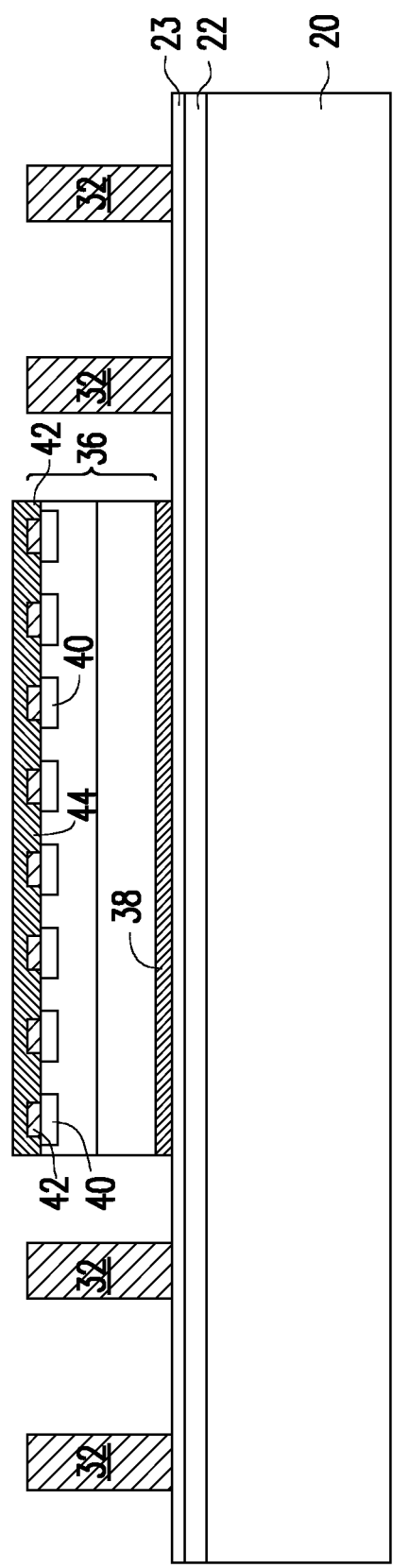

FIG. 5 illustrates the placement/attachment of device die(s) 36. The respective process is illustrated as process 406 in the process flow shown in FIG. 58. Device die 36 is attached to polymer buffer layer 23 through Die-Attach Film (DAF) 38, which is an adhesive film pre-attached on device die 36 before device die 36 is placed on polymer buffer layer 23. Accordingly, DAF 38 and device die 36, before being attached to polymer buffer layer 23, are in combination an integrated piece. Device die 36 may include a semiconductor substrate having a back surface (the surface facing down) in physical contact with DAF 38. Device die 36 may include integrated circuit devices (such as active devices, which include transistors, for example, not shown) at the front surface (the surface facing up) of the semiconductor substrate. In accordance with some embodiments of the present disclosure, device die 36 is a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is at wafer level, although one device die 36 is illustrated, a plurality of device dies 36 are placed over polymer buffer layer 23, and may be allocated as an array including a plurality of rows and a plurality of columns.

In accordance with some example embodiments, metal pillars 42 (such as copper pillars) are pre-formed as portions of device die 36, and metal pillars 42 are electrically coupled to the integrated circuit devices such as transistors (not shown) in device die 36. In accordance with some embodiments of the present disclosure, a dielectric material such as a polymer fills the gaps between neighboring metal pillars 42 to form top dielectric layer 44. Top dielectric layer 44 may also include a portion covering and protecting metal pillars 42. Polymer layer 44 may be formed of PBO or polyimide in accordance with some embodiments of the present disclosure.

Figure 6:
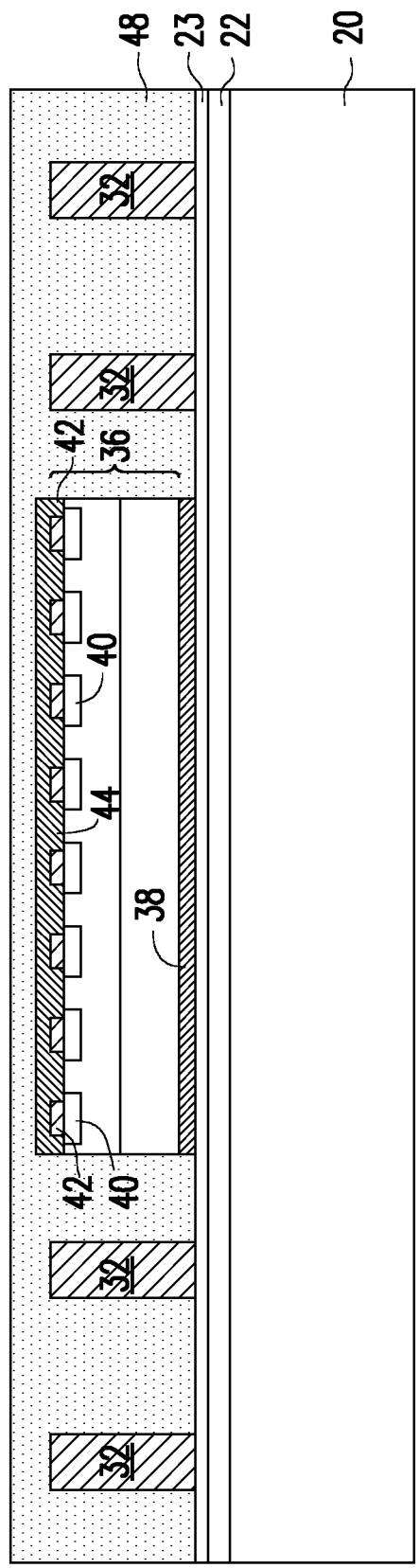

Next, device die 36 and metal posts 32 are encapsulated in encapsulant 48, as shown in FIG. 6. The respective process is illustrated as process 408 in the process flow shown in FIG. 58. Encapsulant 48 fills the gaps between neighboring through-vias 32 and the gaps between through-vias 32 and device die 36. Encapsulant 48 may include a molding compound, a molding underfill, an epoxy, and/or a resin. The top surface of encapsulant 48 is higher than the top ends of metal pillars 42. When formed of molding compound, encapsulant 48 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters. Both the filler particles and the base material in the molding compound may be in physical contact with polymer buffer layer 23.

Figure 7:
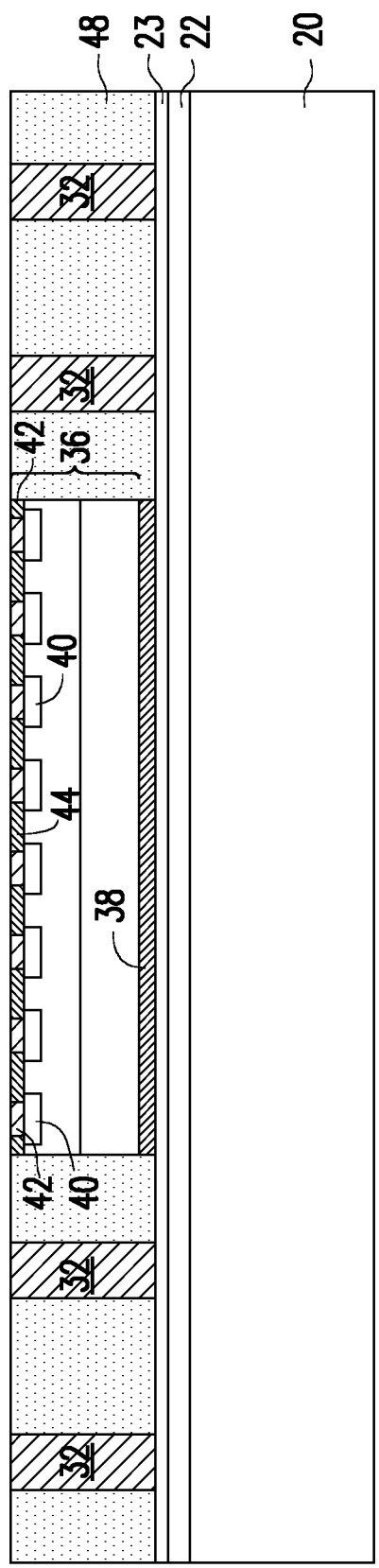

In a subsequent step, as shown in FIG. 7, a planarization process such as a Chemical Mechanical Polish (CMP) process or a mechanical grinding process is performed to planarize encapsulant 48 and dielectric layer 44, until through-vias 32 and metal pillars 42 are exposed. The respective process is also illustrated as process 408 in the process flow shown in FIG. 58. Due to the planarization process, the top ends of through-vias 32 are substantially level (coplanar) with the top surfaces of metal pillars 42, and are substantially coplanar with the top surface of encapsulant 48.

Figure 8:
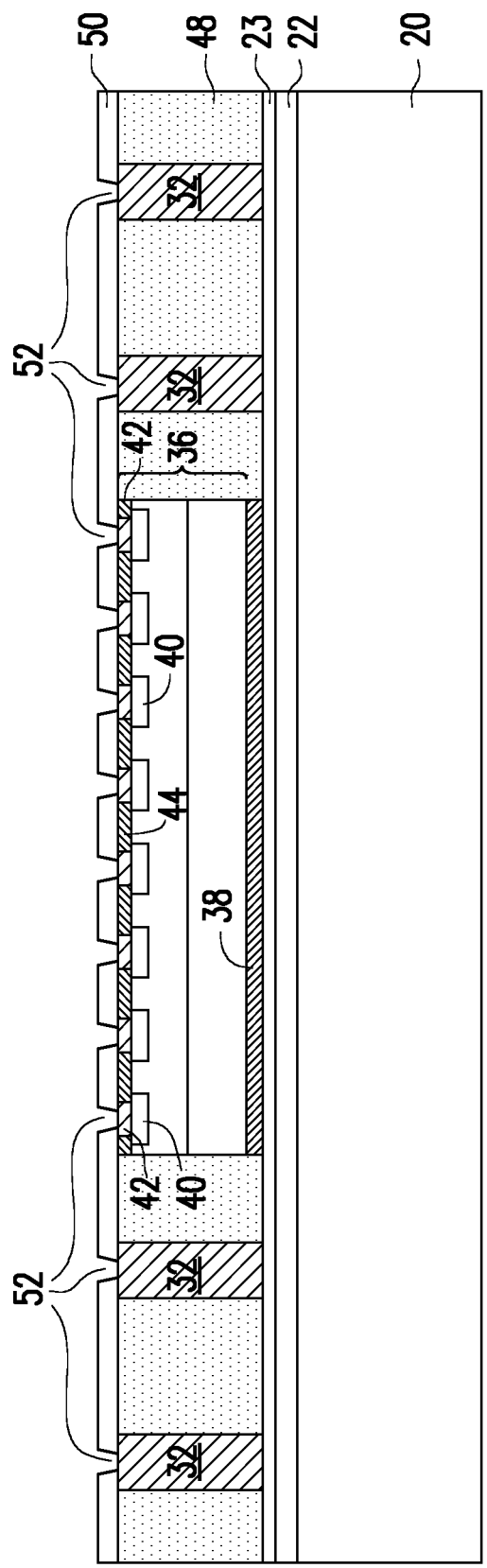
Figure 9:
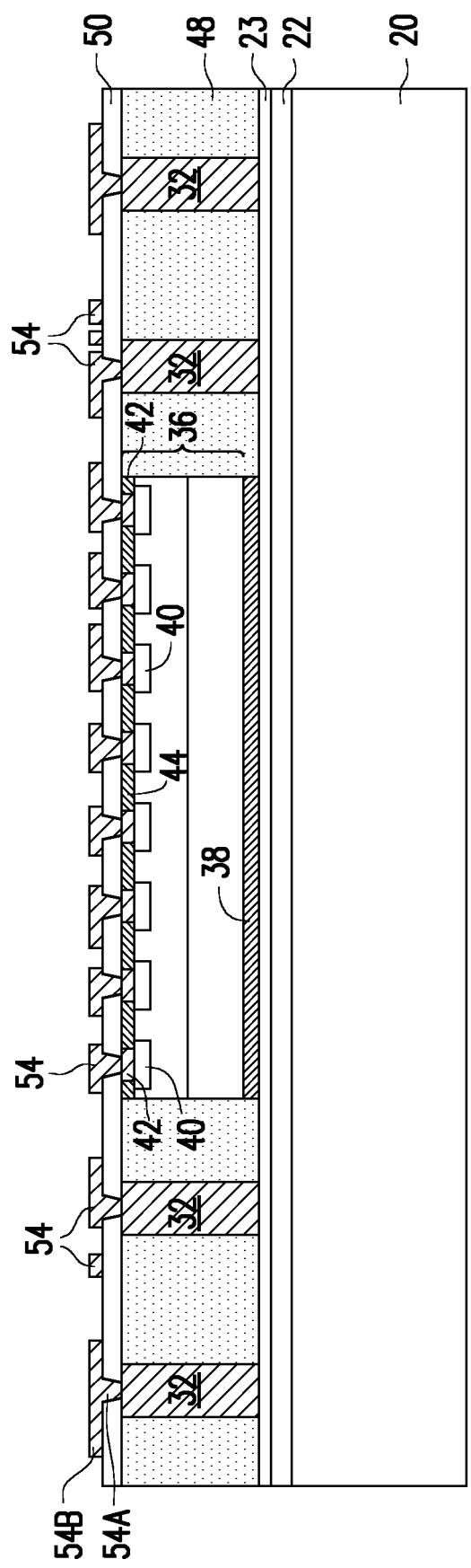

FIGS. 8 through 12 illustrate the formation of a front-side redistribution structure. FIGS. 8 and 9 illustrate the formation of a first layer of Redistribution Lines (RDLs) and the respective dielectric layer. Referring to FIG. 8, dielectric layer 50 is formed. The respective process is illustrated as process 410 in the process flow shown in FIG. 58. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings 52 are then formed, for example, through a photo lithography process. In accordance with some embodiments in which dielectric layer 50 is formed of a photo sensitive material such as PBO or polyimide, the formation of openings 52 involves a photo exposure using a lithography mask (not shown), and a development process. Through-vias 32 and metal pillars 42 are exposed through openings 52.

Next, referring to FIG. 9, RDLs 54 are formed over dielectric layer 50. The respective process is illustrated as process 412 in the process flow shown in FIG. 58. RDLs 54 include vias 54A formed in dielectric layer 50 to connect to metal pillars 42 and through-vias 32, and metal traces (metal lines) 54B over dielectric layer 50. In accordance with some embodiments of the present disclosure, RDLs 54 are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist. Although not shown, the top surfaces of the portions of RDLs 54 grown from openings 52 may be recessed lower than the portion of RDLs 54 directly overlying dielectric layer 50.

Figure 10:
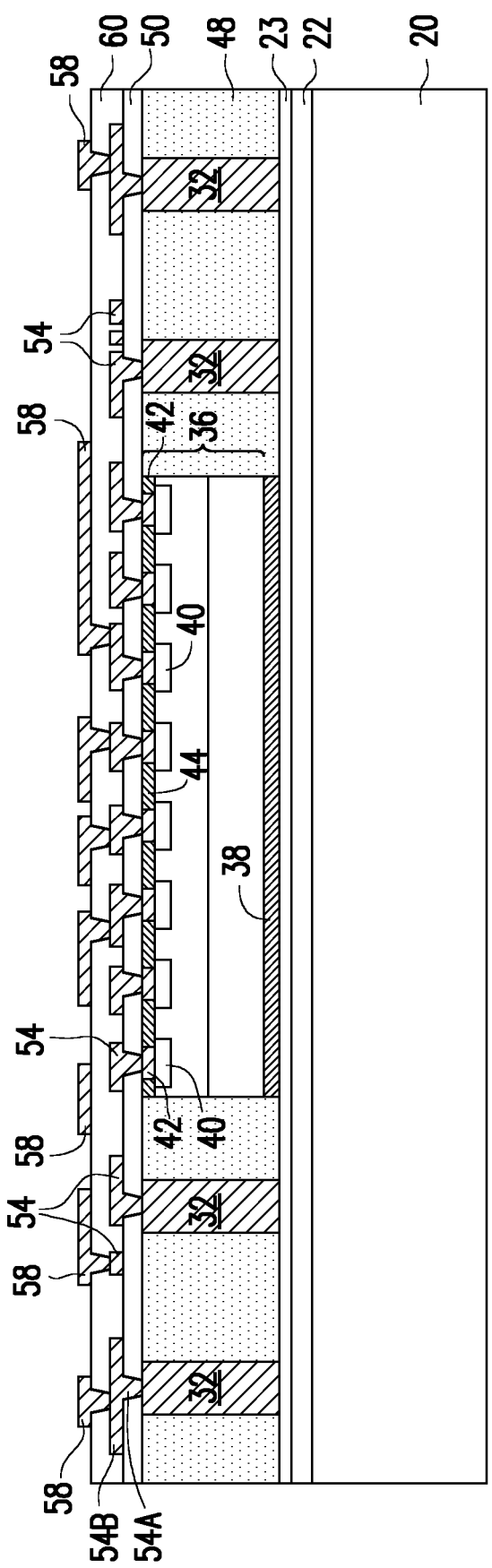

Referring to FIG. 10, in accordance with some embodiments of the present disclosure, dielectric layer 60 is formed over the structure shown in FIG. 9, followed by the formation of openings in dielectric layer 60. Some portions of RDLs 54 are thus exposed through the openings. Dielectric layer 60 may be formed using a material selected from the same candidate materials for forming dielectric layer 50, which may include PBO, polyimide, BCB, or other organic or inorganic materials. RDLs 58 are then formed. The respective process is illustrated as process 414 in the process flow shown in FIG. 58. RDLs 58 also include via portions extending into the openings in dielectric layer 60 to contact RDLs 54, and metal line portions directly over dielectric layer 60. The formation process of RDLs 58 may be the same as the formation of RDLs 54, which includes forming a seed layer, forming a patterned mask, plating RDLs 58, and then removing the patterned mask and undesirable portions of the seed layer.

Figure 11:
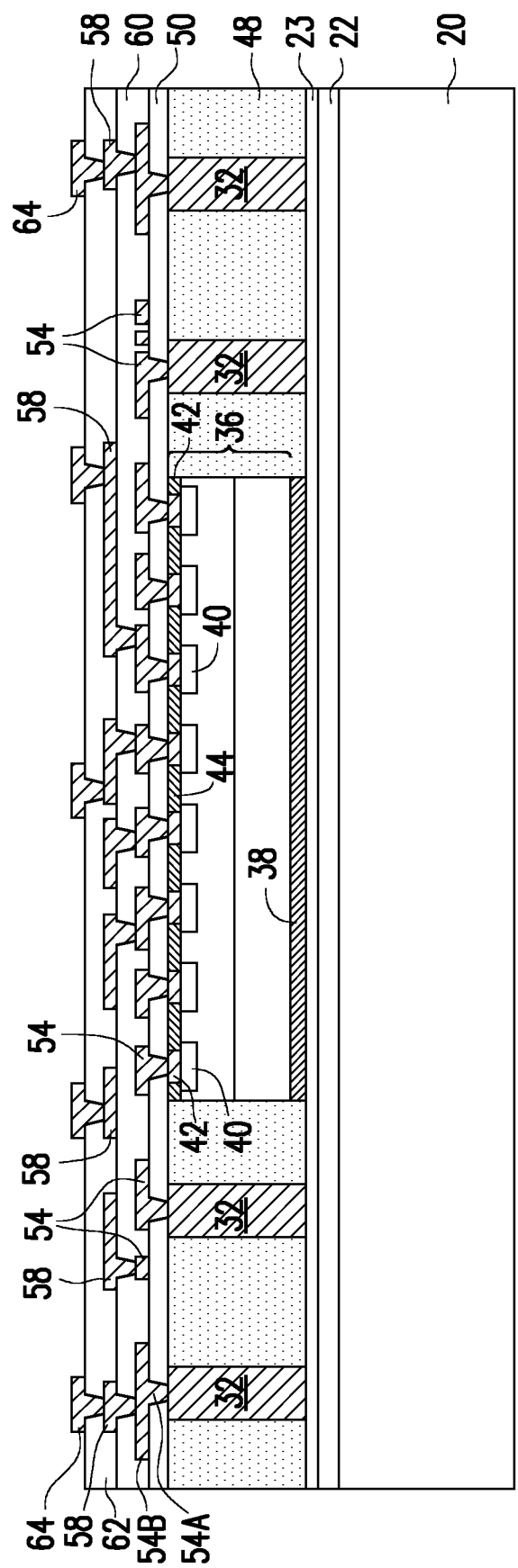

FIG. 11 illustrates the formation of dielectric layer 62 and RDLs 64 over dielectric layer 60 and RDLs 58. The respective process is illustrated as process 416 in the process flow shown in FIG. 58. Dielectric layer 62 may be formed of a material selected from the same group of candidate materials for forming dielectric layers 50 and 60. RDLs 64 may also be formed of a metal or a metal alloy including aluminum, copper, tungsten, or alloys thereof. It is appreciated that although in the illustrated example embodiments, three layers of RDLs (54, 58 and 64) are formed, the package may have any number of RDL layers such as one layer, two layers, or more than three layers.

Figure 12:
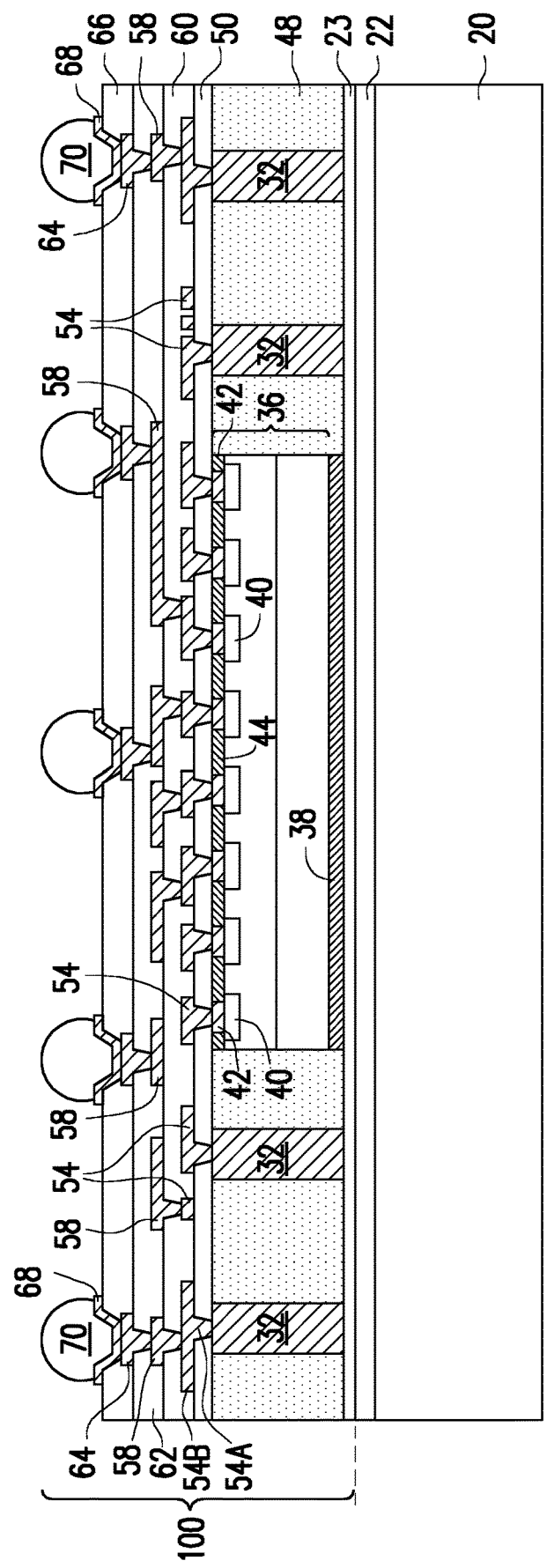

FIG. 12 illustrates the formation of dielectric layer 66, Under-Bump Metallurgies (UBMs) 68, and electrical connectors 70 in accordance with some example embodiments. Dielectric layer 66 may be formed of a material selected from the same group of candidate materials for forming dielectric layers 50, 60, and 62. For example, dielectric layer 66 may be formed using PBO, polyimide, BCB, or the like. Openings are formed in dielectric layer 66 to expose the underlying metal pads, which are parts of RDLs 64 in the illustrative example embodiments. In accordance with some embodiment of the present disclosure, UBMs 68 are formed to extend into the openings in dielectric layer 66 to contact the metal pads in RDLs 64. UBMs 68 may be formed of nickel, copper, titanium, or multi-layers thereof. In accordance with some example embodiments, each of UBMs 68 includes a titanium layer and a copper layer over the titanium layer.

Electrical connectors 70 are then formed. The respective process is illustrated as process 418 in the process flow shown in FIG. 58. The formation of electrical connectors 70 may include placing solder balls on the exposed portions of UBMs 68, and then reflowing the solder balls, and hence electrical connectors 70 are solder regions. In accordance with alternative embodiments of the present disclosure, the formation of electrical connectors 70 includes performing a plating step to form solder layers over UBMs 68, and then reflowing the solder layers. Electrical connectors 70 may also include non-solder metal pillars, or metal pillars and solder caps over the non-solder metal pillars, which may also be formed through plating. Throughout the description, the structure including buffer layer 23 and the overlying structure in combination is referred to as package 100, which is a reconstructed wafer (and also referred to as reconstructed wafer 100 hereinafter) including a plurality of device dies 36.

Figure 13:
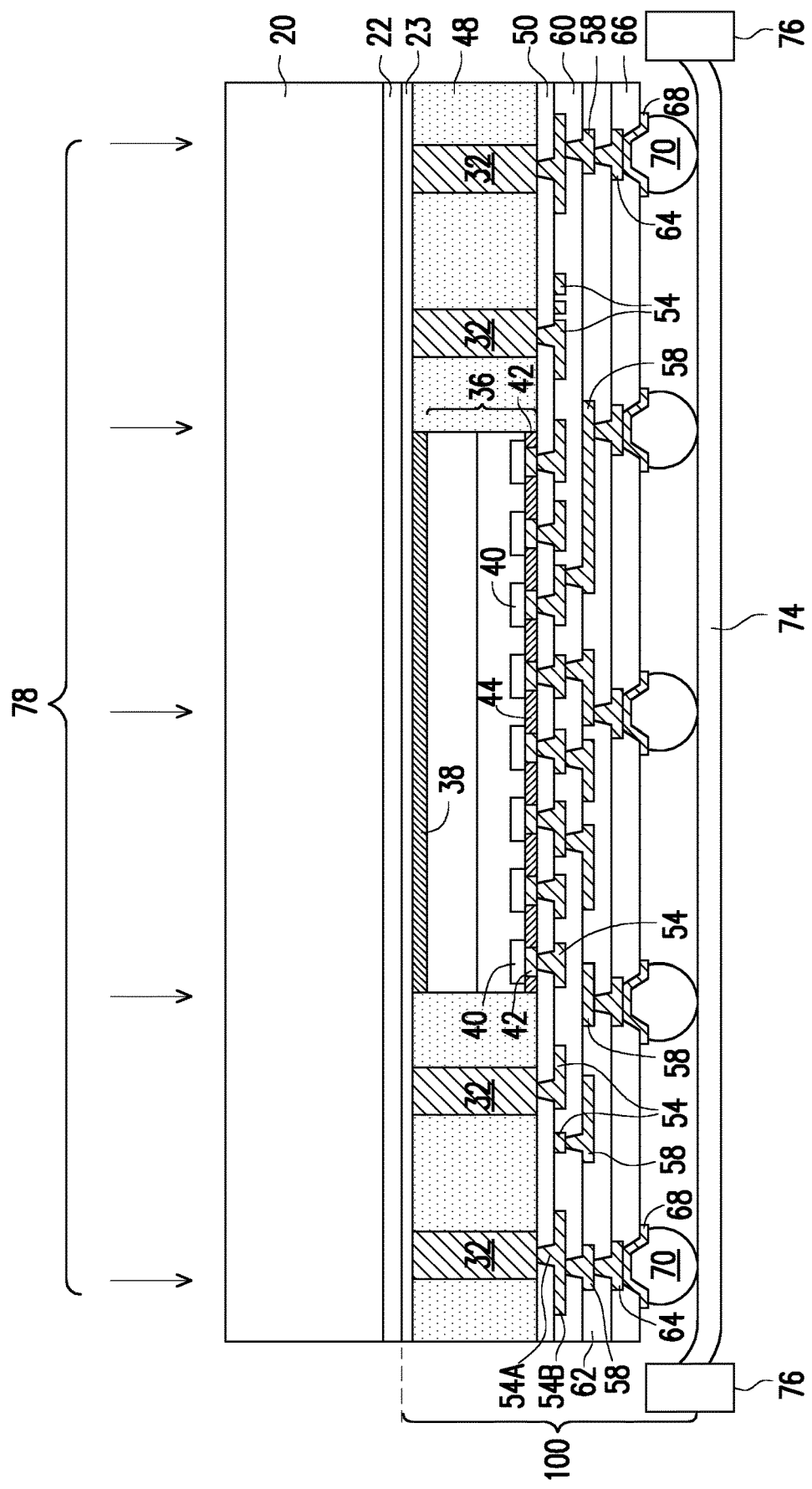

Next, referring to FIG. 13, reconstructed wafer 100 is placed on tape 74, which is attached to frame 76. In accordance with some embodiments of the present disclosure, electrical connectors 70 are in contact with tape 74. Next, light 78 (or other type of heat-carrying radiation source) is projected on release film 22, and light 78 penetrates through the transparent carrier 20. In accordance with some example embodiments of the present disclosure, light 78 is a laser beam, which may be scanned back and forth on release film 22, with each scanning being performed on an un-scanned portion of the release film 22.

Figure 14:
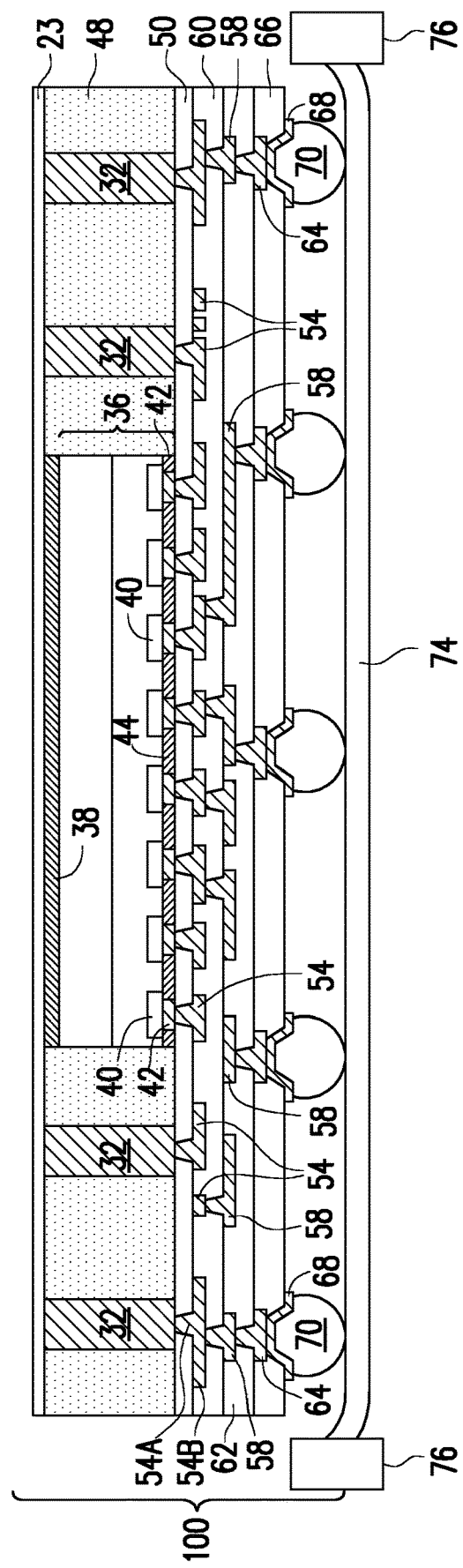

As a result of the light-exposure (such as the laser beam scanning), carrier 20 may be lifted off from release film 22, and hence reconstructed wafer 100 is de-bonded (de-mounted) from carrier 20. The respective process is illustrated as process 420 in the process flow shown in FIG. 58. The resulting reconstructed wafer 100 is shown in FIG. 14.

In accordance with some embodiments of the present disclosure, after the lift-off of carrier 20, the remaining release film 22 is removed, hence exposing the underlying polymer buffer layer 23. The respective process is illustrated as process 422 in the process flow shown in FIG. 58. The removal of release film 22 may be through a plasma cleaning step, for example, using the plasma of nitrogen ($N_2$), oxygen ($O_2$), $CF_4$, and the like.

Figure 15:
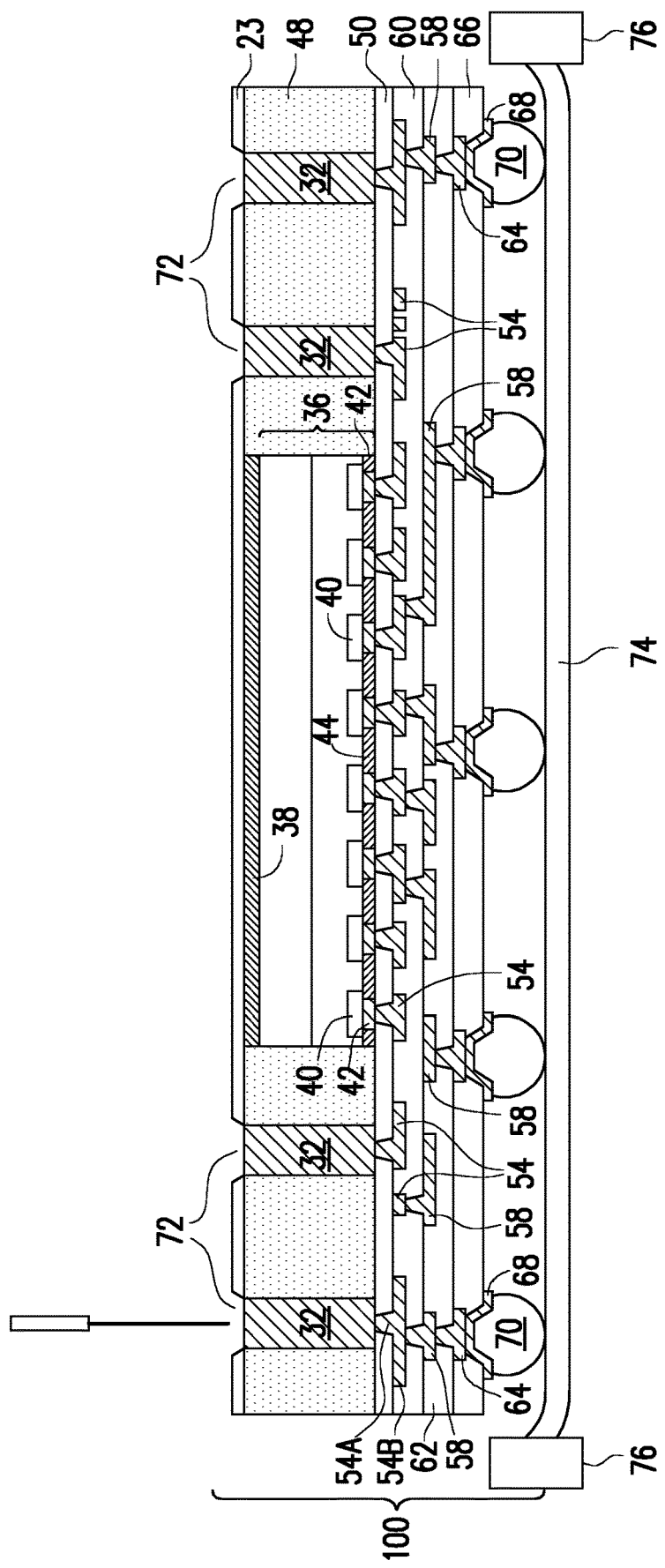

Referring to FIG. 15, openings 72 are formed in dielectric buffer layer 23, and hence through-vias 32 are exposed. The respective process is illustrated as process 424 in the process flow shown in FIG. 58. In accordance with some embodiments of the present disclosure, openings 72 are formed through laser drill. In accordance with alternative embodiments of the present disclosure, openings 72 are formed through etching in a lithography process.

Figure 16:
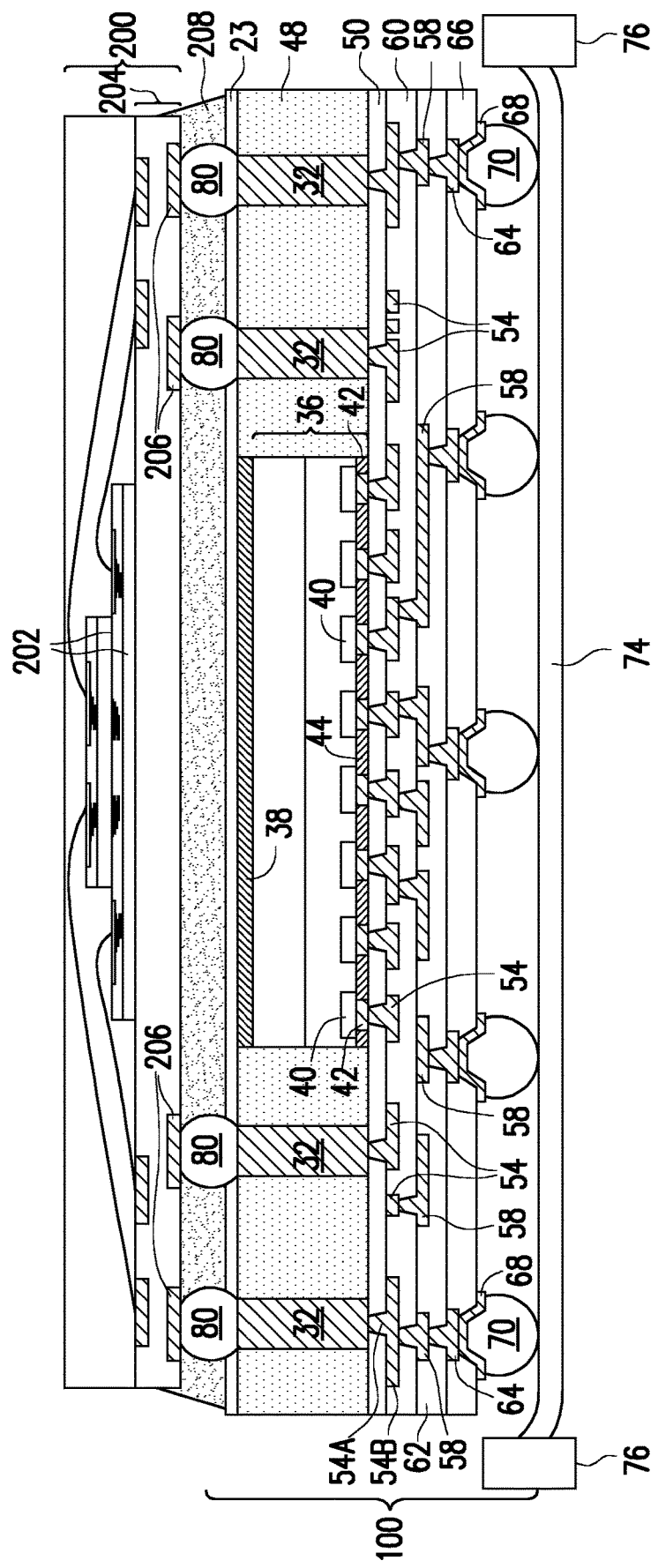
Figure 17:
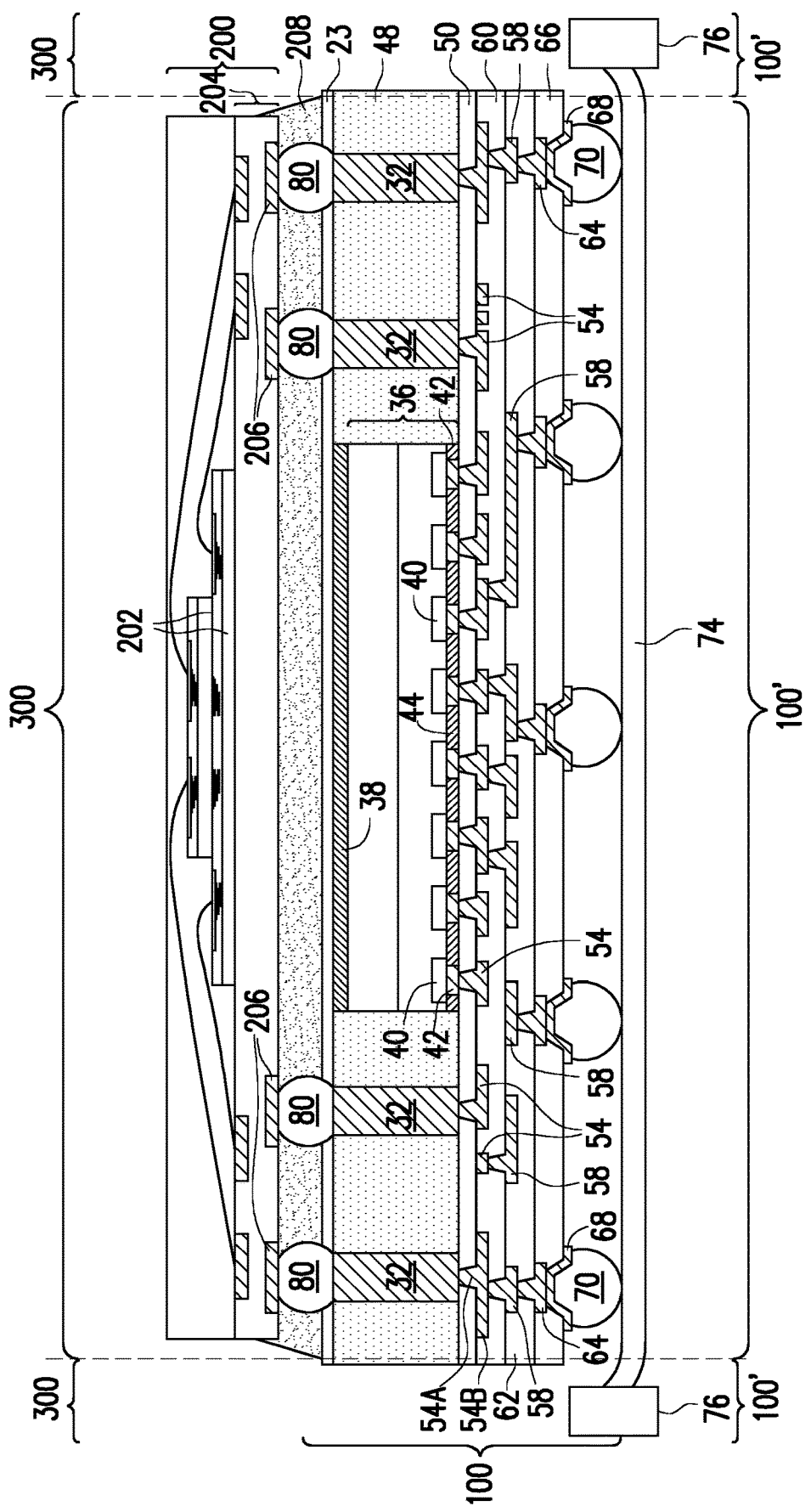

Reconstructed wafer 100 includes a plurality of packages 100' (refer to FIG. 17), which are identical to each other, with each of packages 100' including a plurality of through-vias 32 and one or more device die 36. FIG. 16 illustrates the bonding of a plurality of packages 200 (with one package 200 illustrated) onto reconstructed wafer 100, thus forming a plurality of identical Package-on-Package (PoP) structure/ packages 300 (FIG. 17). The bonding is performed through solder regions 80, which join through-vias 32 to metal pads 206 in the overlying package 200. In accordance with some embodiments of the present disclosure, package 200 includes package substrate 204 and device die(s) 202, which may be memory dies such as Static Random Access Memory (SRAM) dies, Dynamic Random Access Memory (DRAM) dies, or the like. Underfill 208 is also disposed into the gap between packages 200 and the underlying reconstructed wafer 100, and is cured.

In accordance with alternative embodiments of the present disclosure, instead of bonding package 200 to reconstructed wafer 100 directly through openings 72 (FIG. 15), backside RDLs (not shown) are formed over dielectric buffer layer 23, and package 200 is bonded over the backside RDLs in the backside redistribution structure. The backside RDLs are such named since these RDLs, if formed, will be on the backside of device die 36. In order to form the backside RDLs, a carrier, instead of a tape, may be placed under reconstructed wafer 100 as a support in the formation of the backside RDLs. Accordingly, electrical connectors 70 are adhered to the carrier through an adhesive film (not shown) during the formation of the backside RDLs.

Next, referring to FIG. 17, a singulation (die-saw) process is performed to separate reconstructed wafer 100 into individual packages 300, which are identical to each other. The singulation may be performed when reconstructed wafer 100 is located on tape 74. The singulation may be performed using a blade, or may be performed using a laser beam to perform pre-grooving, so that grooves are formed, and then using a blade to cut through the grooves.

Figure 18:
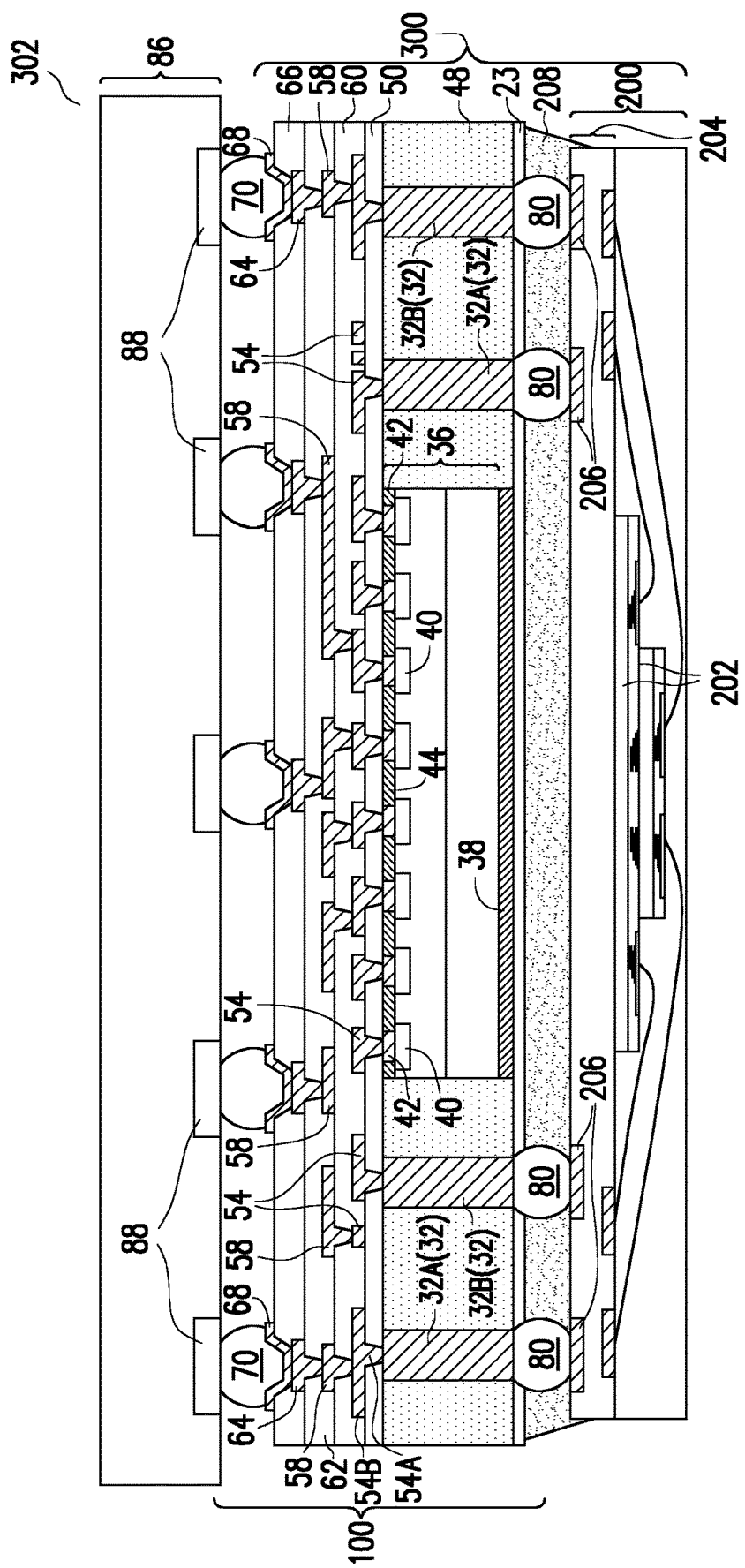

FIG. 18 illustrates the bonding of the singulated package 300 to package component 86 through solder regions 70, thus forming package 302. The respective process is illustrated as process 426 in the process flow shown in FIG. 58. In accordance with some embodiments of the present disclosure, package component 86 is a package substrate, which may be a coreless substrate or a substrate having a core. In accordance with other embodiments of the present disclosure, package component 86 is a printed circuit board or a package. Solder regions 70 may be bonded to bond pads 88 in package component 86.

Figure 19:
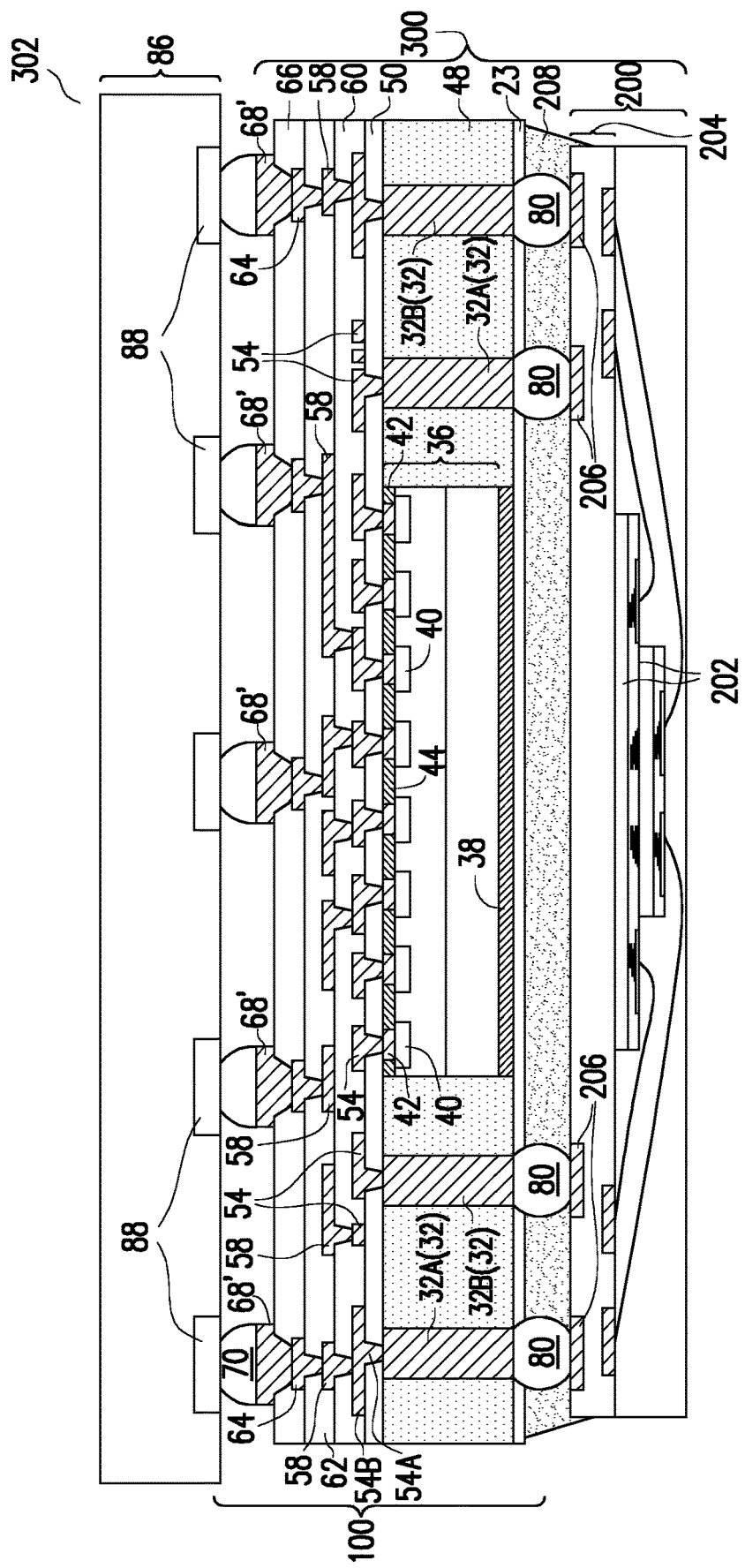
FIGS. 19 and 20 illustrate the cross-sectional views of some packages in accordance with some embodiments.

FIG. 19 illustrates package 302 formed in accordance with alternative embodiments. Package 302 in FIG. 19 is essentially the same as the package 302 shown in FIG. 18, except metal pillars 68' replace the UBMs 68 in FIG. 18.

Figure 20:
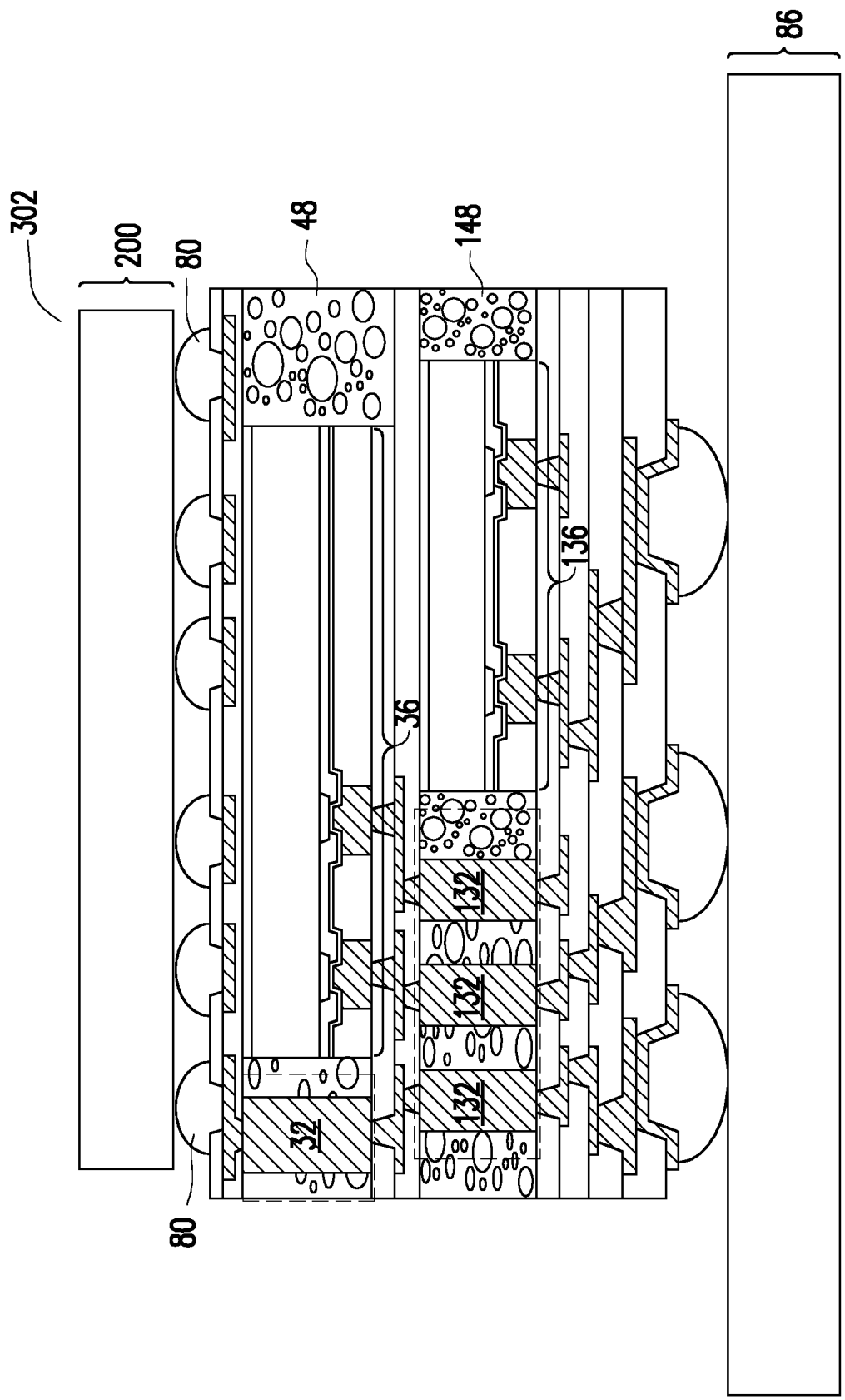

FIG. 20 illustrates package 302 formed in accordance with alternative embodiments. Package 302 in FIG. 20 is similar to the package 302 shown in FIG. 18, except that in addition to the through-vias 32 in encapsulant 48, another tier of through-vias 132 and encapsulant 148 are formed. Throughout the description, all discussions of through-vias 32 (such as what are shown in FIGS. 21 through 57, when applicable) may apply similarly to through-vias 132, and all discussions of encapsulant 48 throughout the description (when applicable) may apply similarly to encapsulant 148.

FIGS. 21 through 31 illustrate the schematic views of package 100', device die 36, and through-vias 32 in accordance with some embodiments. It is appreciated that the individual through-vias 32 are not illustrated. Rather, the collections of through-vias 32 are illustrated as strips, rings, or the like, wherein each illustrated section (such as strip) of through-vias may include a plurality of individual through-vias 32 therein, and the details of through-vias 32 may be found referring to FIGS. 34 through 57.

Figure 21:
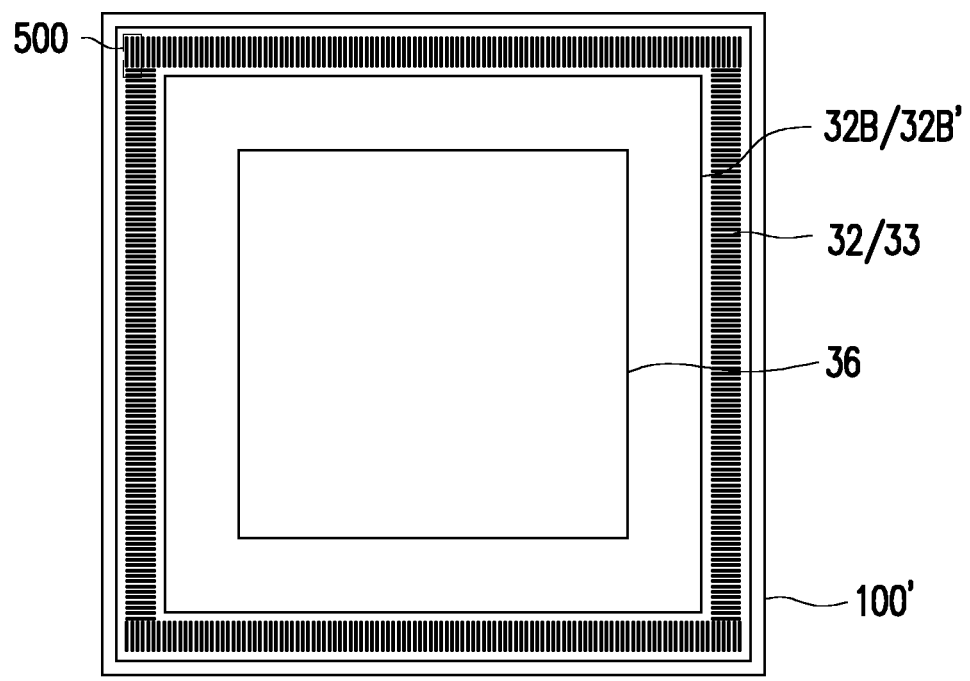
FIGS. 21 through 31 schematically illustrate the top views of arrangements of through-vias and device dies in accordance with some embodiments.
Figure 22:
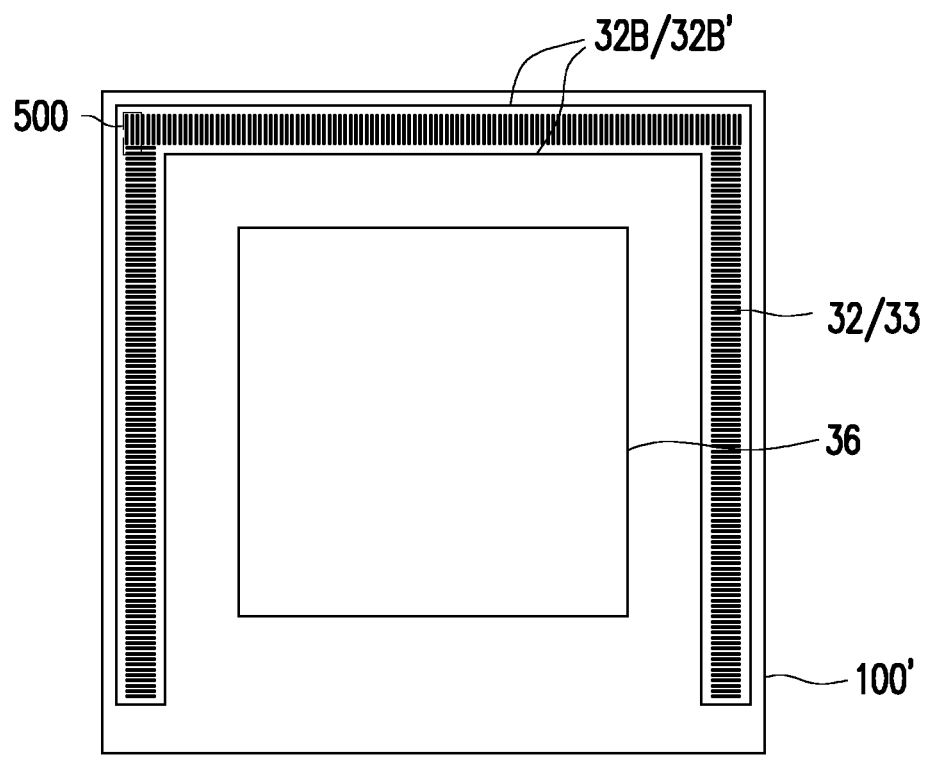
Figure 23:
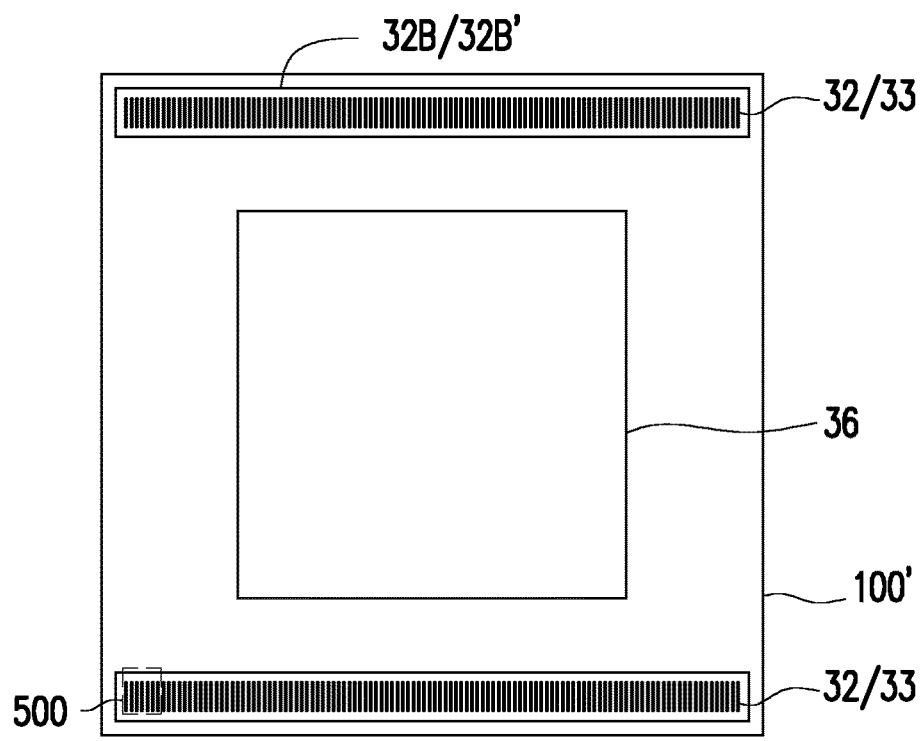
Figure 24:
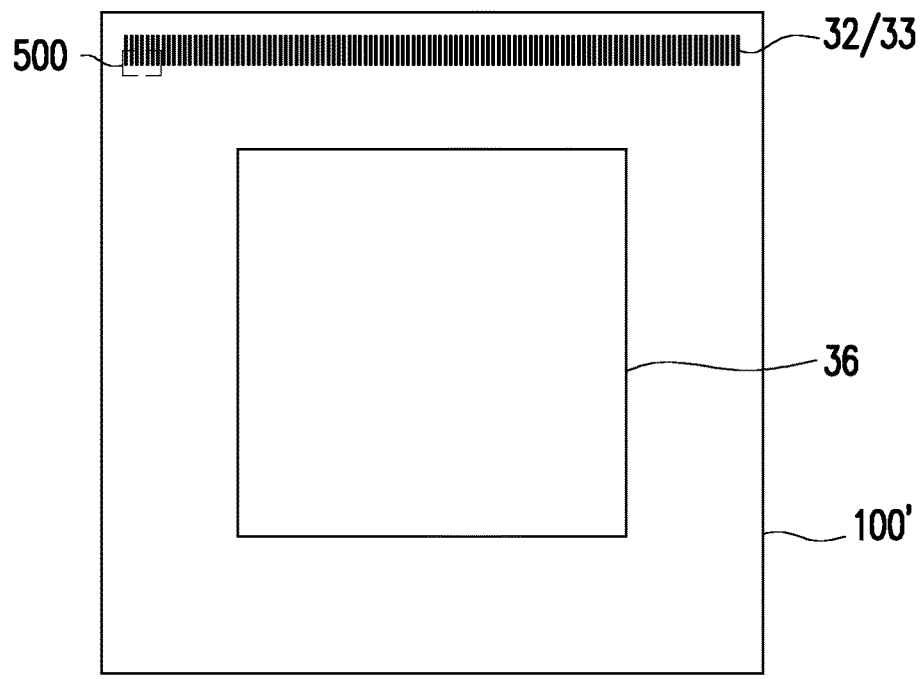
Figure 25:
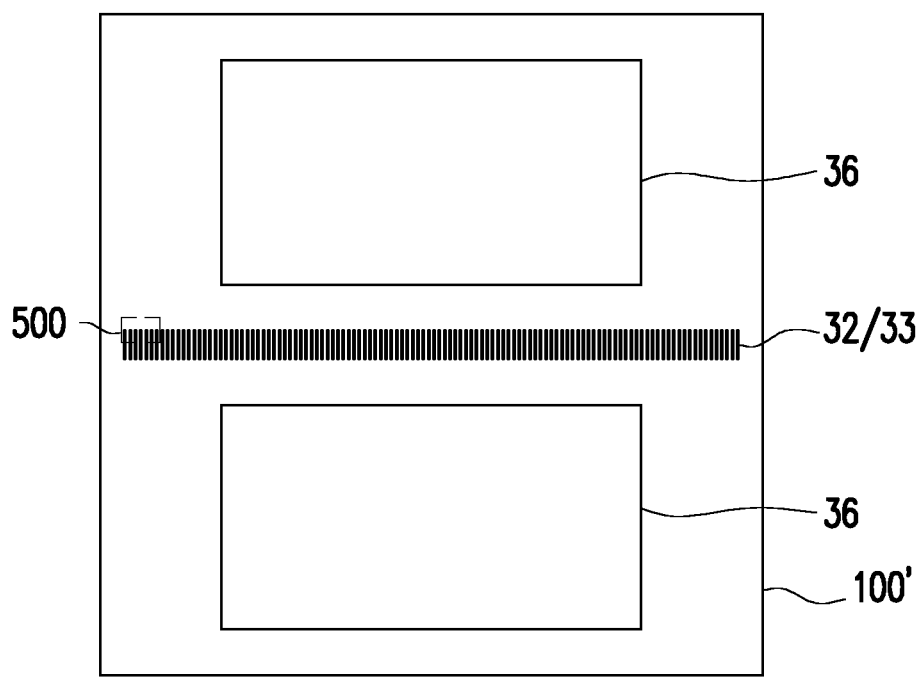
Figure 26:
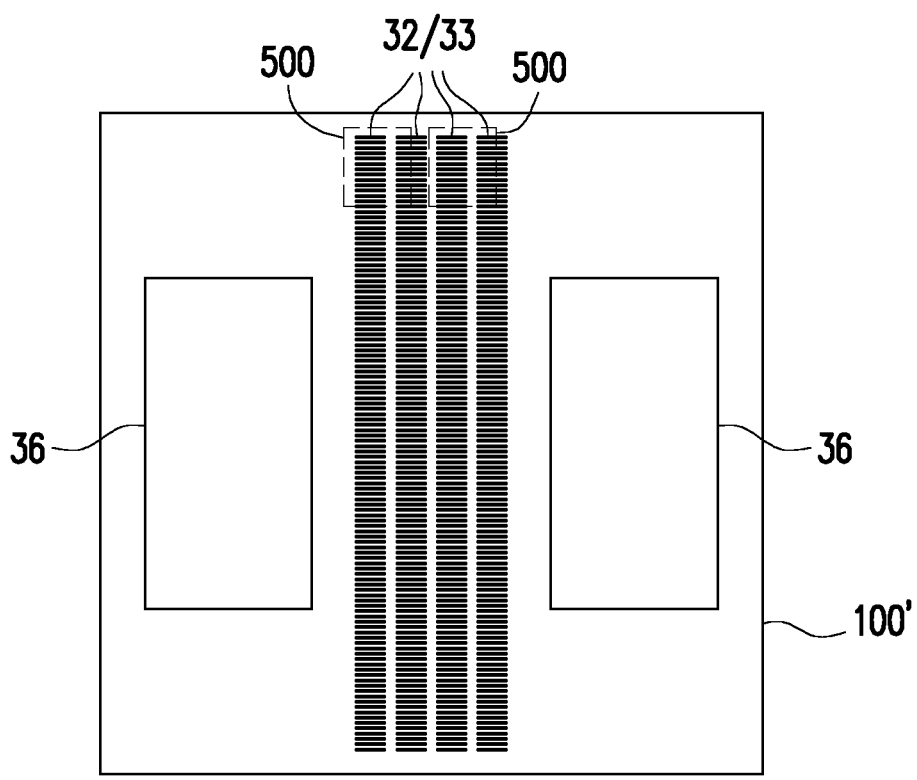
Figure 27:
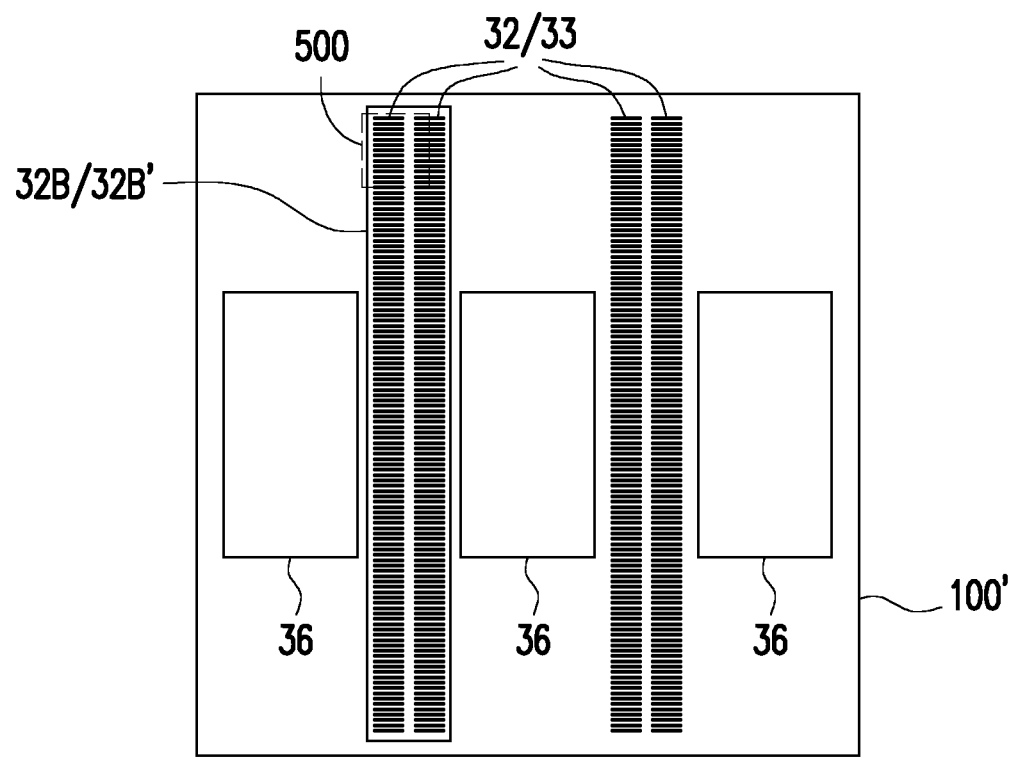
Figure 28:
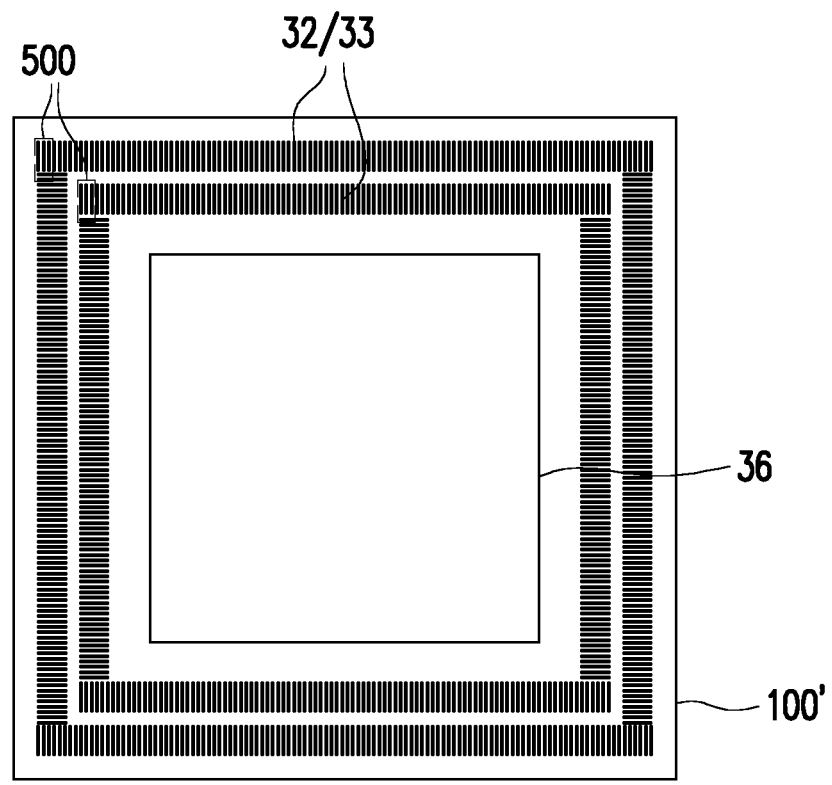
Figure 29:
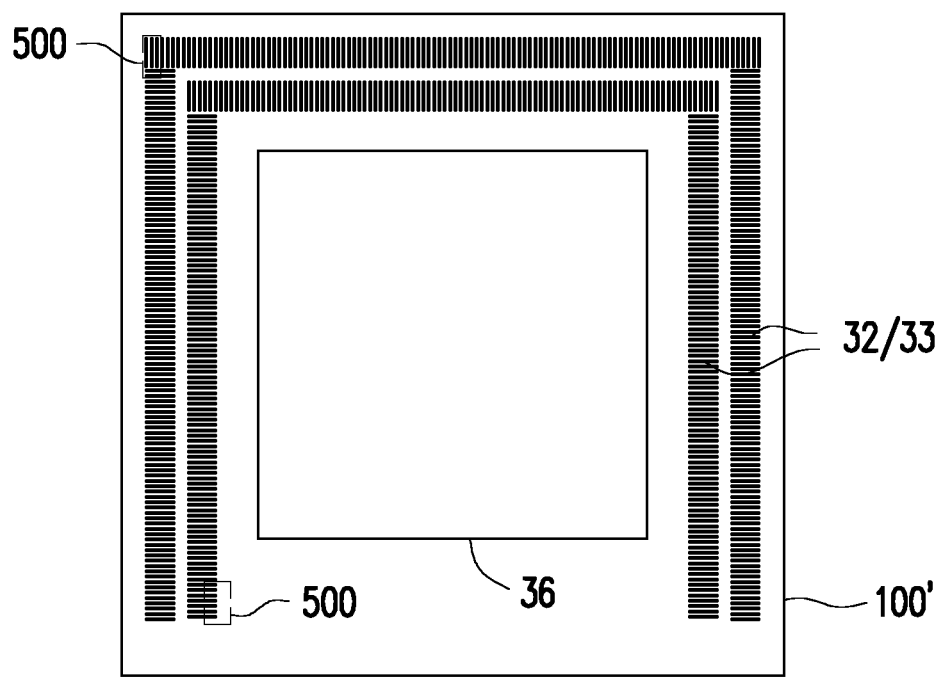
Figure 30:
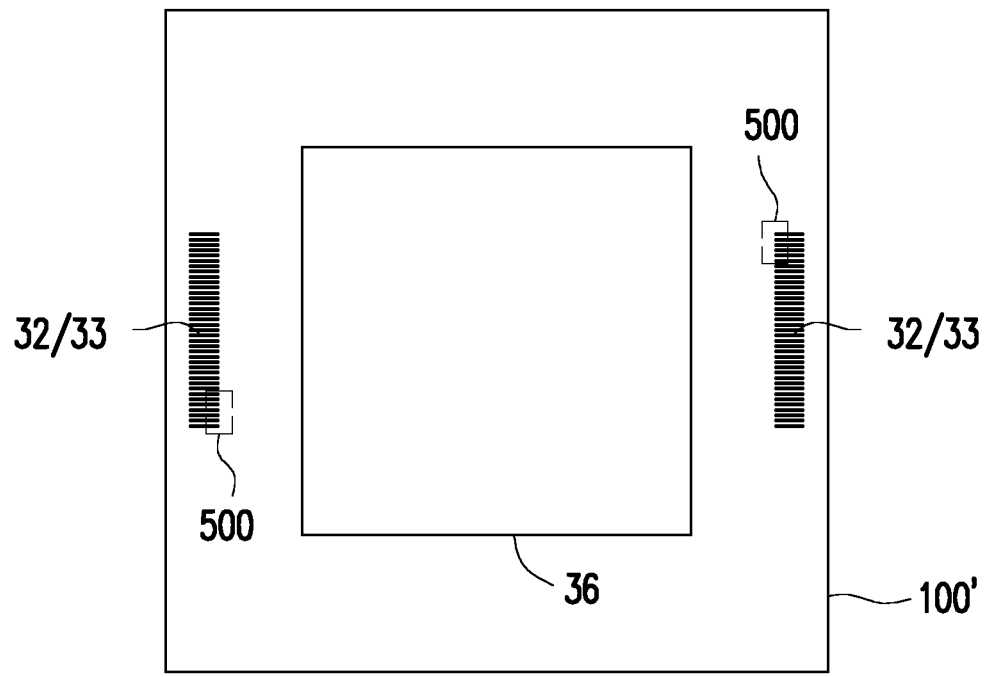
Figure 31:
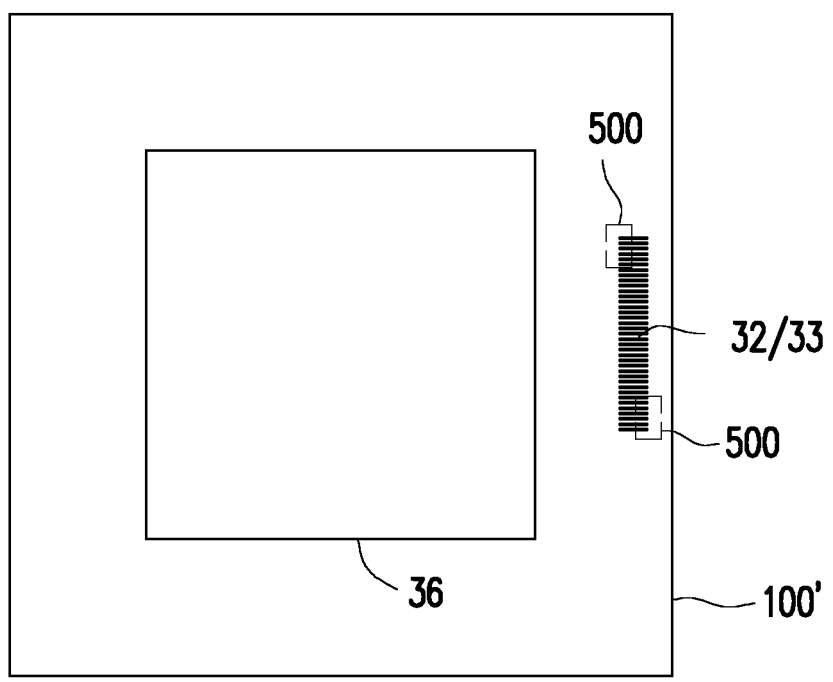

Referring to FIG. 21, through-vias 32, which may form array 33, may be aligned to a ring, which is formed close to the peripherals of package 100'. Device die 36 is encircled by the ring. Each of the four sides of the ring may include an array of through-vias 32. FIG. 22 illustrates that the through-vias 32 are aligned to three lines, each proximate a side of package 100'. FIGS. 23 and 24 illustrate that through-vias 32 are aligned to two lines and one line, respectively, of the respective package 100', with the lines proximate the sides of package 100'. FIG. 25 illustrates that through-vias 32 are aligned to a line in the middle of package 100'. Device dies 36 may be placed on the opposite sides of the line. FIG. 26 illustrates that through-vias 32 are aligned to a plurality of (such as 4) lines in the middle of package 100', with device dies 36 being placed on the opposite sides of the four groups of through-vias 32. FIG. 27 illustrates that through-vias 32 are aligned to a plurality of lines, which separate three device dies 36 from each other. FIG. 28 illustrates that through-vias 32 may be aligned to two rings, with the outer ring encircling the inner ring. FIG. 29 illustrates package 100' with two groups of through-vias 32, with each of the two groups including three sides. FIG. 30 illustrates two groups of through-vias, each proximate an edge of package 100'. FIG. 31 illustrates one group of through-vias 32 proximate an edge of package 100'.

FIGS. 34 through 53 illustrate the plane view (top view or bottom view) of through-vias 34 in accordance with some embodiments. The structures shown in FIGS. 34 through 53 may be the amplified views of the regions 500 in FIGS. 21 through 31. There may be one or more (such as two as illustrated) arrays 33 of through-vias 32A, which may have the same shape and the same size as each other. Enlarged through-vias 32B may be formed next to arrays 33 and immediately neighboring through-via-free spaces, and/or may be inserted between arrays 33. When there are two arrays 33 of through-vias 32A, the inner-array spacing S1 (FIG. 34) between the neighboring through-vias 32A is smaller than the inter-array spacing S2 between neighboring arrays 33.

In accordance with some embodiments of the present disclosure, each of through-vias 32A may be an active through-via, which is used for carrying electrical signals or power. Each of enlarged through-vias 32B, on the other hand, may be an active through-via (which are used for carrying electrical signals or power), or a dummy through-via (which may be electrically floating). Furthermore, referring to FIGS. 18 and 19, when enlarged-vias 32B are dummy through-vias, there may be, or may not be, any RDL 54 and/or electrical connector 80 electrically coupling to them. Accordingly, the enlarged through-vias 32B may be fully enclosed in dielectric materials, or may be electrically connected to RDLs 54 and/or electrical connectors 80. Furthermore, some of dummy enlarged through-vias 32B may be in contact with RDLs 54 and/or electrical connectors 80, while are still electrically floating since the corresponding RDLs 54 and/or electrical connectors 80 are electrically floating.

Referring to FIGS. 34 and 35, enlarged through-vias 32B include two portions 32B1 and 32B2. Enlarged through-vias 32B1 are on the outer side of arrays 33, and are between arrays 33 and through-via-free regions. Enlarged through-vias 32B2 are between arrays 33 to fill the spaces between arrays 33. At least one of the length and the width of enlarged through-vias 32B is greater than the corresponding length/width of through-vias 32A, and the other is equal to or greater than the corresponding length/width of through-vias 32A. In accordance with some embodiments, through-vias 32B1 are elongated, with the lengthwise directions parallel to the directions of the force applied on the respective enlarged through-vias 32B1 during the removal of plating mask 26 (FIGS. 3 and 4). Accordingly, the possibility of through-vias 32B1 to tilt/peel during the removal of the plating mask 26 is reduced. On the other hand, enlarged through-vias 32B2 fills some space between arrays 33, and hence the force applied on the corresponding neighboring through-vias 32A is reduced. Furthermore, enlarged through-vias 32B2 are larger, and hence are less likely to peel. FIG. 35 is similar to the embodiment in FIG. 34, except the top-view shapes of enlarged through-vias 32B2 are more elongated.

Figure 37:
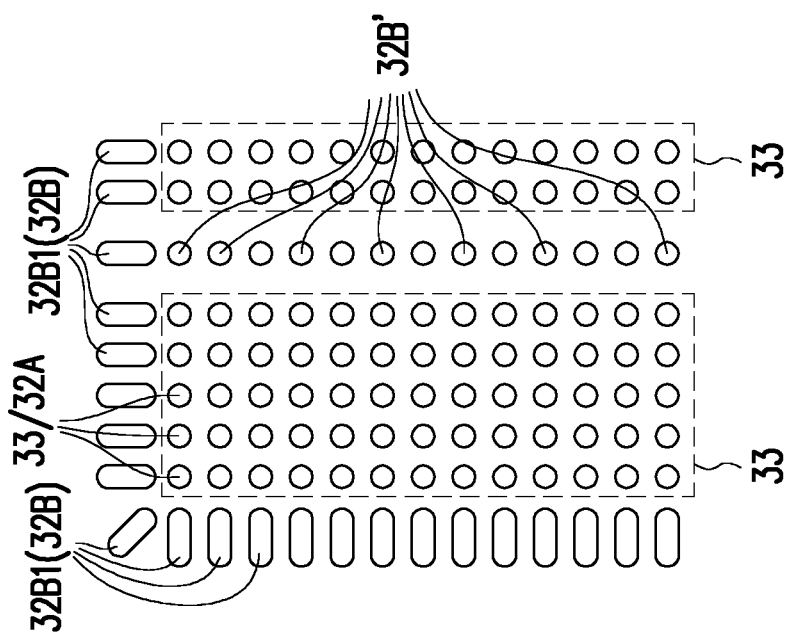

FIGS. 36 and 37 illustrate the embodiments similar to the embodiments shown in FIG. 34 except dummy through-vias 32B' are used to replace enlarged through-vias 32B2. Dummy through-vias 32B' are added between arrays 33 to reduce the through-via-free spacing between arrays 33. Dummy through-vias 32B' may have the same top-view shape and the same size as through-vias 32A, or may be larger than through-vias 32A. Dummy through-vias 32B' are electrically floating.

Figure 38:
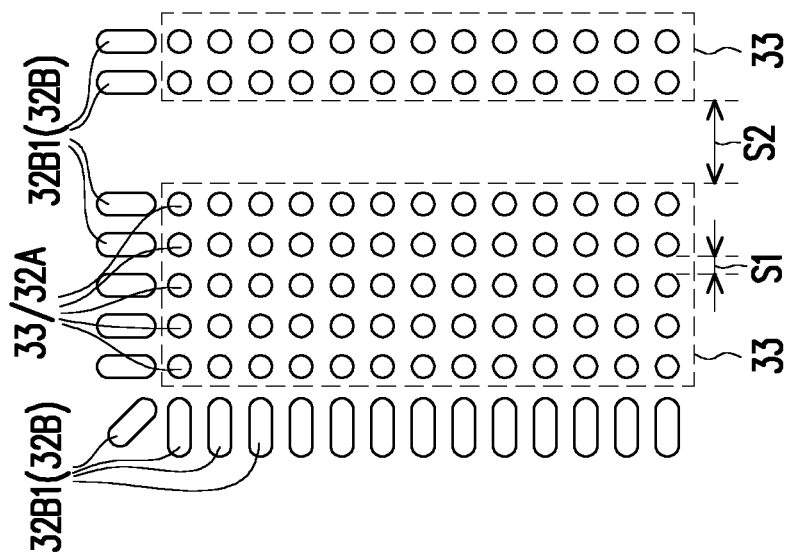
Figure 43:
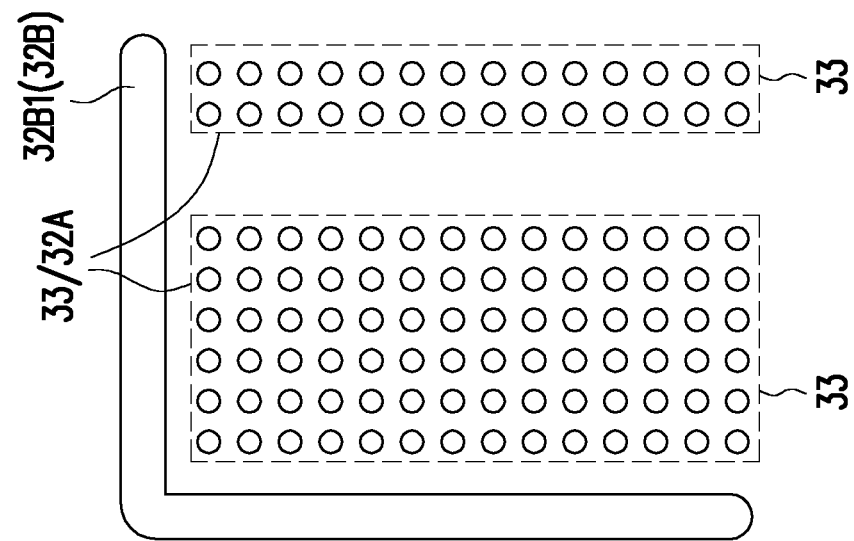
Figure 42:
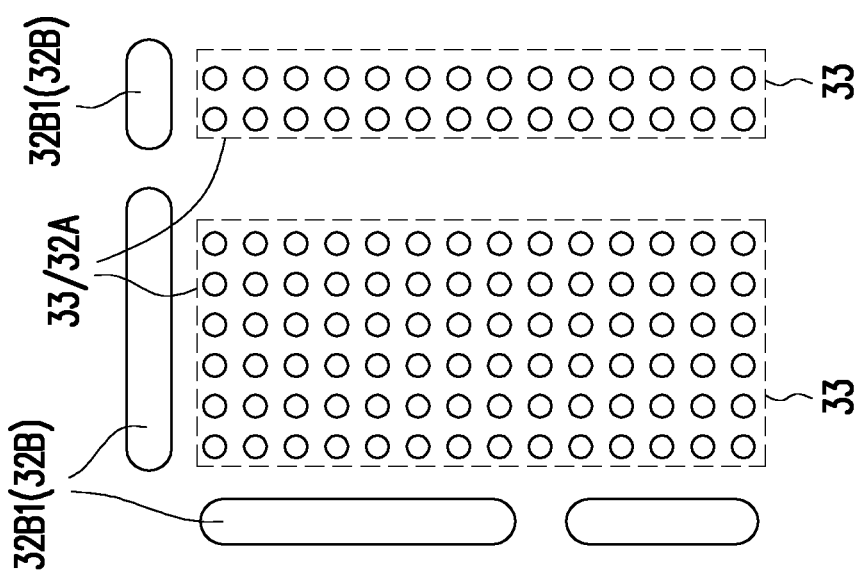

FIGS. 38, 39, 40, 41, and 42 illustrate enlarged through-vias 32B1 with different top-view shapes and sizes. In accordance with these embodiments, no dummy through-vias are added between neighboring arrays, although the inter-array spacing S2 (FIG. 38) in accordance with these embodiments is significantly greater than inner-array spacing S1 (FIG. 38). FIG. 43 illustrates an embodiment in which a long enlarged through-vias 32B1 includes two sides forming an L-shape.

Figure 46:
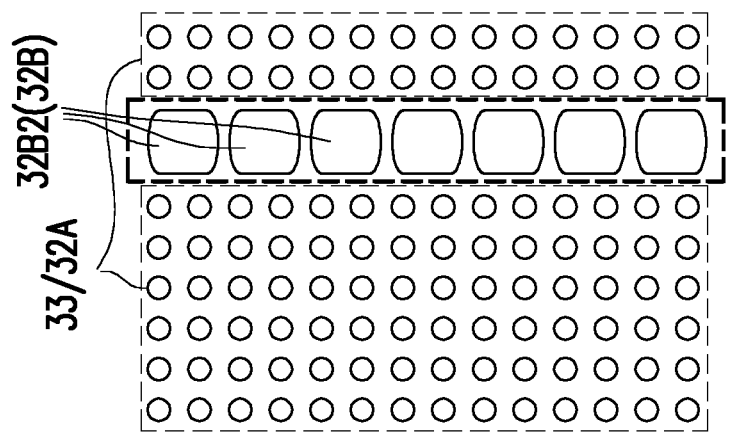
Figure 45:
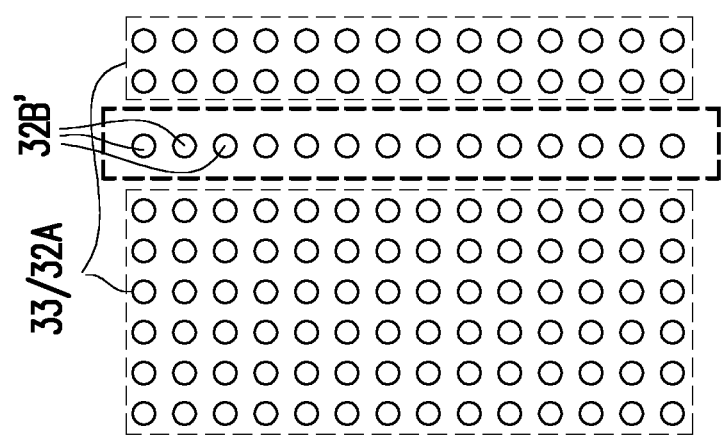
Figure 44:
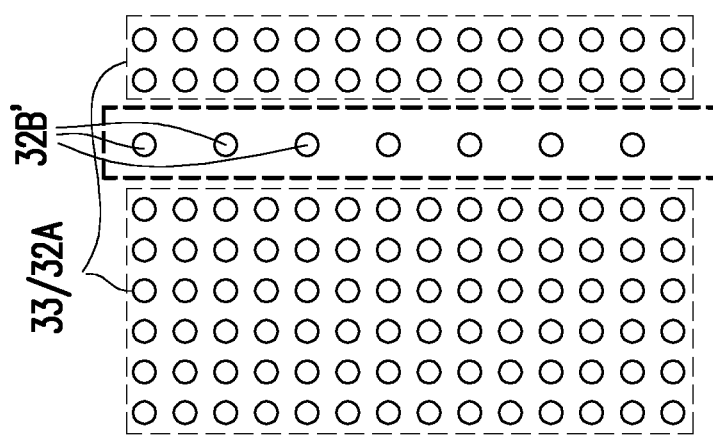
Figure 49:
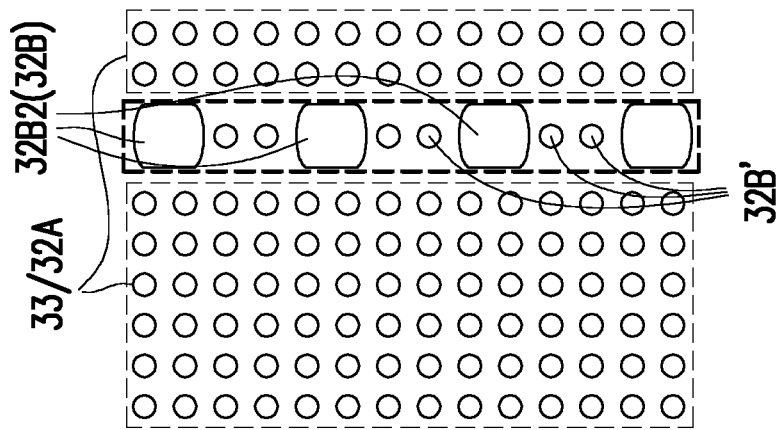
Figure 48:
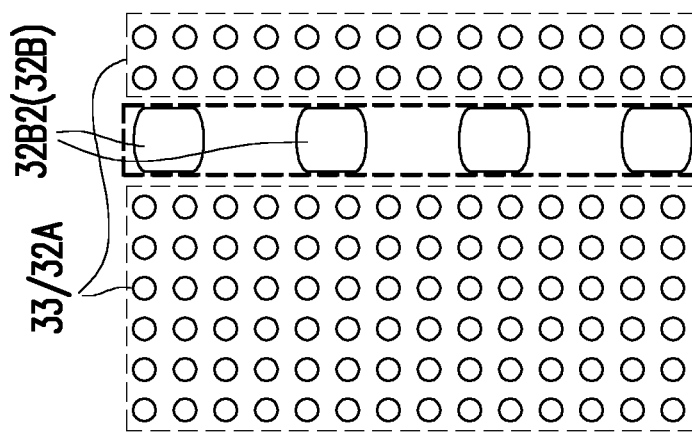
Figure 47:
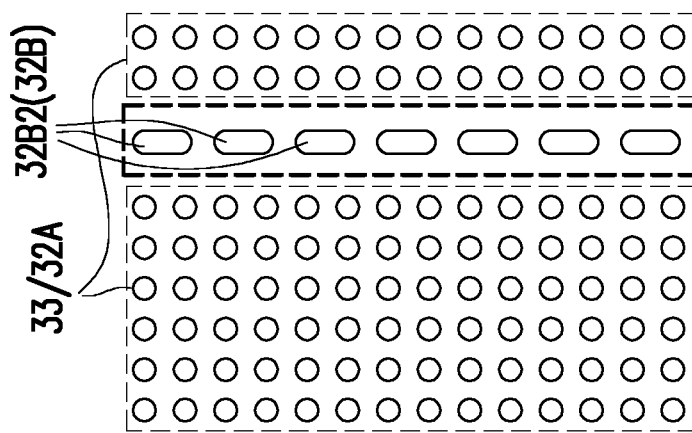

FIGS. 44, 45, 46, 47, 48, and 49 illustrate that no enlarged through-vias are formed on the outer sides of arrays 33. Dummy through-vias 32B' may be formed in accordance with some embodiments. Dummy through-vias 32B' are electrically floating. FIGS. 44 and 45 illustrate dummy through-vias 32B' between arrays 33. Dummy 32B' may be spaced apart further than the through-vias 32A in neighboring rows, as shown in FIG. 44, or may have the spacing same as the through-vias 32A in neighboring rows, as shown in FIG. 45. FIGS. 46, 47, and 48 illustrate some example enlarged through-vias 32B2 between arrays 33. FIG. 49 illustrates the formation of both dummy through-vias 32B' and enlarged through-vias 32B2, which may be arranged alternatingly.

Figure 50:
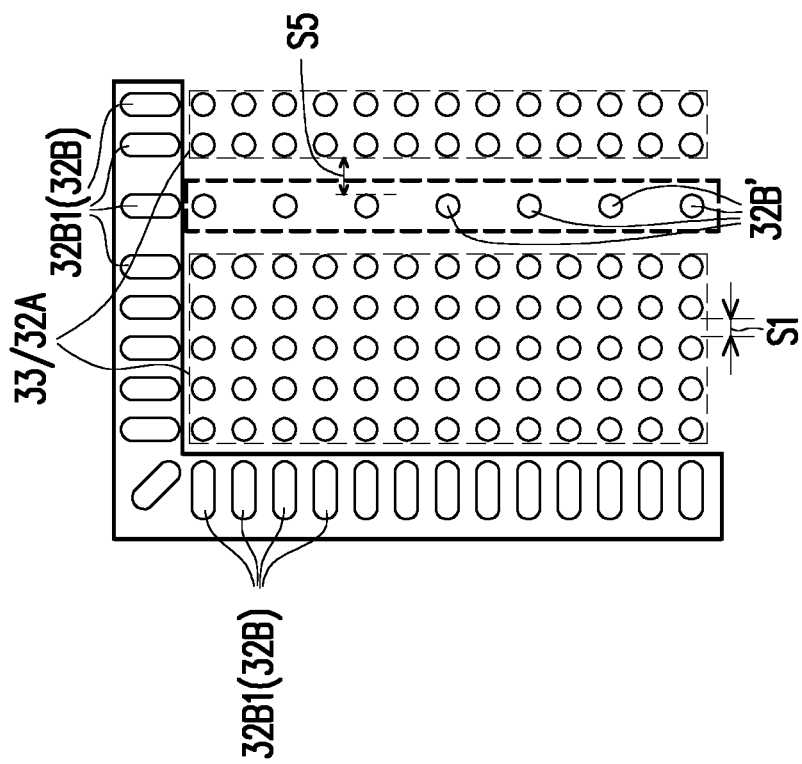
Figure 53:
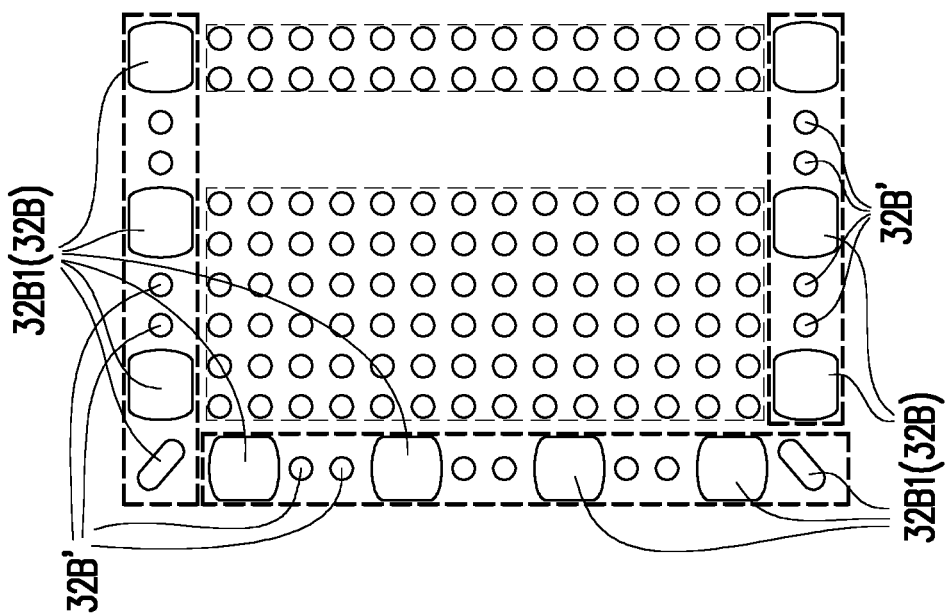
Figure 52:
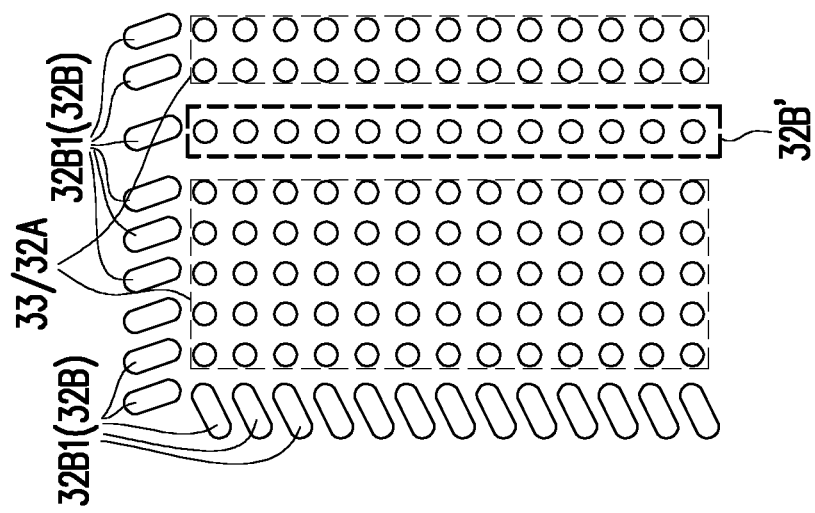
Figure 51:
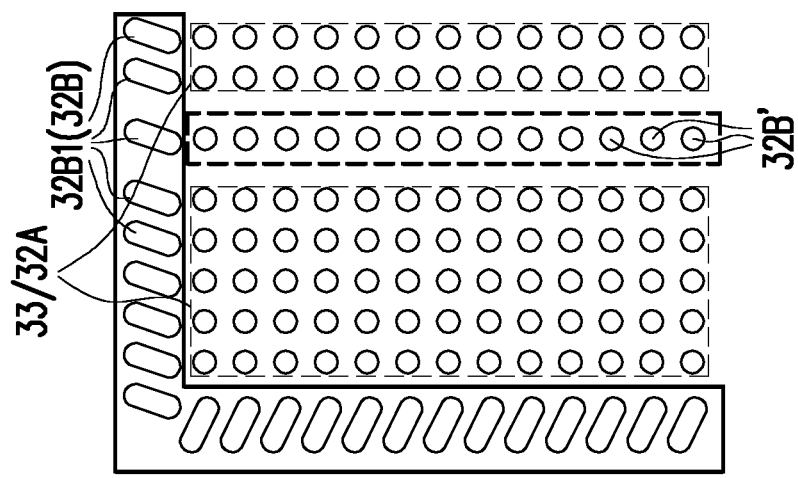
Figure 55:
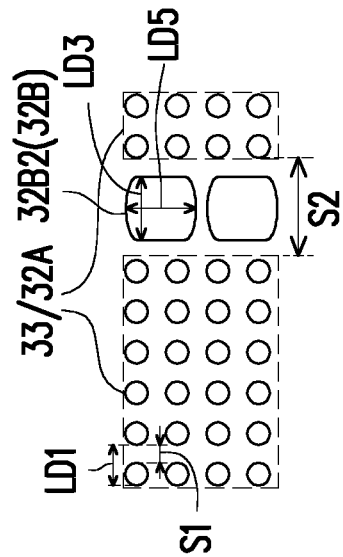
FIGS. 54 through 57 illustrate the top views and the dimensions of through-vias in accordance with some embodiments.

FIG. 50 illustrates some embodiments, in which dummy through-vias 32B' and enlarged through-vias 32B1 are formed. The spacing S5 from dummy through-vias 32B' to neighboring through-vias 32A may be larger than inner spacing S1. FIGS. 51 and 52 illustrate the tilted enlarged through-vias 32B1, which are elongated and having lengthwise directions neither parallel to nor perpendicular to the row direction or the column direction of arrays 33. The tilting directions of the enlarged through-vias 32B1 in FIG. 52 are opposite to that in FIG. 51. FIG. 53 illustrates that some enlarged through-vias 32B1 that are not tilted, and may or may not be elongated, are added. Also, some dummy through-vias 32B' may be inserted between enlarged through-vias 32B1.

In the example embodiments shown in FIGS. 21 through 31, there are through-via-dense regions of through-vias 32, as represented by each of the illustrated lines, and through-via-free regions free from through-vias 32. Through-vias 32 include through-vias 32B immediately neighboring the through-via-free regions. For example, the through-vias 32 closest to the respective edges of package 100', closest to device dies 36, and the through-vias closest to the space between neighboring arrays 33 of through-vias may be through-via-free regions. Throughout the description, if a spacing from an array of through-vias 32A to the neighboring edge of package 100', neighboring device die 36, or the neighboring array 33 is greater than about 5 times the inner-array spacing S1 (FIG. 34, for example) between neighboring through-vias 32A in the array, the respective space is the through-via-free regions. Enlarged through-vias are accordingly formed between the through-via-dense regions and the through-via-free regions, while the through-vias not immediately neighboring pattern-sparse regions are not enlarged, as shown in FIGS. 34 through 57 as some examples.

Referring back to FIGS. 21 through 31, enlarged through-vias 32B1 and/or dummy through-vias 32B' (FIGS. 34 through 57) may be formed to encircle each of the arrays 33 in FIGS. 21 through 31, and may be aligned to the rings encircling arrays 33 if arrays 33 also form rings. For example, FIGS. 21, 22, 23, and 27 illustrate the rings formed of enlarged through-vias 32B1 and/or dummy 32B', and the formation of enlarged through-vias 32B1 and/or dummy 32B' for other Figures among FIGS. 21 through 31 may also be contemplated.

FIGS. 54, 55, 56, and 57 illustrate the top views of through-vias in accordance with some embodiments. In these figures, through-vias 32A, dummy through-vias 32B', and enlarged through-vias 32B have lateral dimensions LD1, LD2, and LD3, respectively. Depending on the shapes of these features, the lateral dimensions may be length, widths or diameters. When enlarged through-vias 32B are elongated, the lengthwise dimensions of through-vias 32B1 and 32B2 may be LD4 and LD5, respectively. The inter-array spacing between neighboring arrays 33 and the inner-array spacing between neighboring through-vias 32A in arrays 33 are referred to as S2 and S1, respectively. In accordance with some embodiments, inner-array spacing S1 may be in the range between about 5 μm and about 20 μm, and inter-array spacing may be in the range between about 50 μm and about 200 μm. Ratio S2/S1 may be in the range between about 5 and 20. The lateral dimension LD1 of through-vias 32A may be in the range between about 20 μm and about 60 μm. The lateral dimension LD2 of dummy through-vias 32B' may be in the range between about 40 μm and about 80 μm. The lateral dimension LD3 (FIGS. 55 and 56) of enlarged through-vias 32B2 may be in the range between about 40 μm and about 120 μm. The lateral dimension LD4 (FIGS. 55 and 56) of enlarged through-vias 32B1 may be in the range between about 60 μm and about 140 μm. The lateral dimension LD5 (FIG. 56) of enlarged through-vias 32B2 may be in the range between about 60 μm and about 140 μm. Tilt angle θ (FIG. 56) of the corner enlarged through-vias 32B1 may be in the range between, and including, 0 degrees and 90 degrees, and may also be in the range between about 40 degrees and about 60 degrees, or equal to about 45 degrees. In accordance with some embodiments wherein enlarged through-vias 32B are on the outer side of array 33, spacing S3 (FIGS. 56 and 57) between through-vias 32B and the nearest through-via 32A may be equal to or greater than spacing S1, for example, with ratio S3/S1 being between (and including) 1 and about 5. The outer spacing S4 (FIGS. 56 and 57) between through-vias 32B and the nearest features (through vias, device dies, the edge of package 100', etc.) may be equal to or greater than spacing S1, for example, with ratio S4/S1 being between (and including) 1 and about 20. Also, in FIG. 57, ratio LD4/LD1 may be greater than about 4 to ensure the added round enlarged through-vias 32B1 are large enough to resist tilting and peeling.

Figure 54:
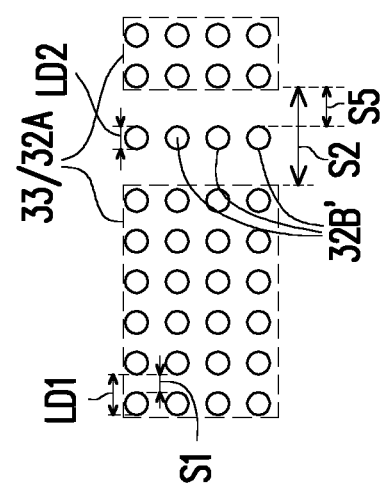
Figure 57:
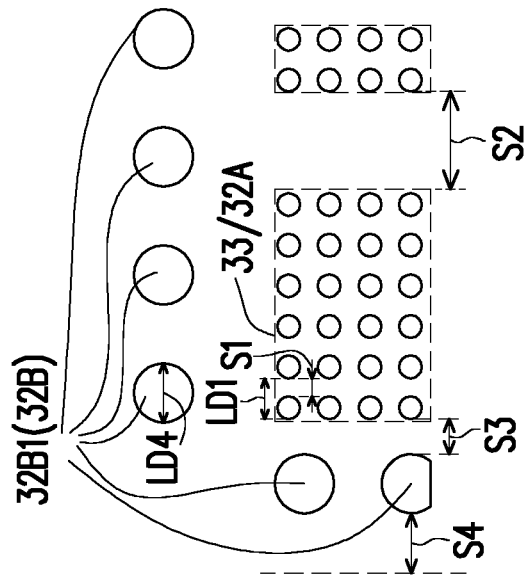
Figure 56:
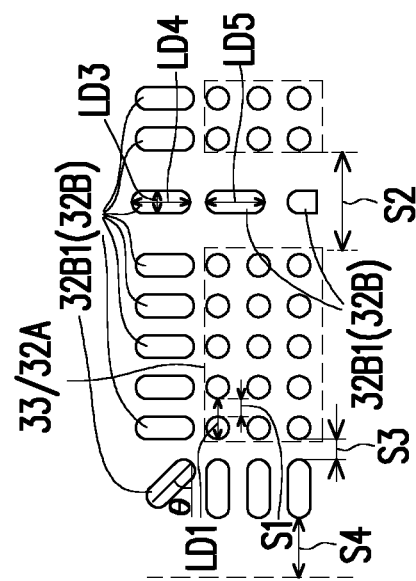

In accordance with some embodiments of the present disclosure, as shown in FIG. 54, the difference (S2−2S1) is greater than or equal to lateral dimension LD2 to ensure that the spacing S2 is large enough to place dummy through-vias 32B' therein, and the resulting spacing S5 between dummy through-vias 32B' and the nearest through-via 32A is not smaller than inner-array spacing S1. Furthermore, lateral dimension LD2 is equal to or greater than lateral dimension LD1 to ensure dummy through-vias 32B' has good resistance to tilting/peeling.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By placing enlarged through-vias wherein tilting/peeling is likely to occur, the peeling of the through-vias is reduced. Furthermore, inserting enlarged through-vias and/or dummy through-vias between arrays may reduce the through-via-free spacing, and hence reduce the force applied on the through-vias, which also leads to the reduction in the tilting/peeling of the through-vias.

In accordance with some embodiments of the present disclosure, a package comprises a device die; an encapsulant encapsulating the device die therein; a first plurality of through-vias penetrating through the encapsulant, wherein the first plurality of through-vias comprise a first array; a second plurality of through-vias penetrating through the encapsulant, wherein the second plurality of through-vias are outside of the first array, and wherein the second plurality of through-vias are larger than the first plurality of through-vias; and redistribution lines over and electrically coupling to the first plurality of through-vias. In an embodiment, the second plurality of through-vias comprise active through-vias electrically coupling to the redistribution lines. In an embodiment, the package further comprises dummy through-vias outside of the first array and penetrating through the encapsulant. In an embodiment, the dummy through-vias have a same size and a same shape as the first plurality of through-vias. In an embodiment, the second plurality of through-vias are aligned to a straight line parallel to a row direction or a column direction of the first array. In an embodiment, the first plurality of through-vias further comprise a second array, and the package further comprises a third plurality of through-vias penetrating through the encapsulant, wherein the third plurality of through-vias separate the first array from the second array, and the third plurality of through-vias are larger than the first plurality of through-vias. In an embodiment, the first plurality of through-vias further comprise a second array, and the package further comprises a plurality of dummy through-vias separating the first array from the second array. In an embodiment, the first plurality of through-vias are rounded with each having a first diameter, and the second plurality of through-vias are rounded with each having a second diameter greater than the first diameter. In an embodiment, the first plurality of through-vias are rounded with each having a diameter, and wherein the second plurality of through-vias are elongated with each having a width equal to or greater than the diameter, and a length greater than the width.

In accordance with some embodiments of the present disclosure, a package comprises a molding compound; a device die molded in the molding compound; a plurality of through-vias molded in the molding compound, wherein each of the plurality of through-vias has a first lateral size; a first plurality of enlarged through-vias molded in the molding compound, wherein each of the first plurality of enlarged through-vias have a second lateral size greater than the first lateral size; and redistribution lines over and electrically coupling to both of the plurality of through-vias and the first plurality of enlarged through-vias. In an embodiment, the plurality of through-vias are rounded with each having a first diameter, and the first plurality of enlarged through-vias are rounded with each having a second diameter greater than the first diameter. In an embodiment, the plurality of through-vias are rounded with each having a diameter, and wherein the first plurality of enlarged through-vias are elongated with each having a width equal to or greater than the diameter, and a length greater than the width. In an embodiment, the first plurality of through-vias have lengthwise directions pointing from the plurality of through-vias outwardly. In an embodiment, the package further comprises a second plurality of enlarged through-vias molded in the molding compound, wherein the second plurality of enlarged through-vias separate the plurality of through-vias into two arrays. In an embodiment, the package further comprises dummy through-vias aligned to a same straight line with some portions of the first plurality of enlarged through-vias, wherein the dummy through-vias are electrically floating, and are molded in the molding compound.

In accordance with some embodiments of the present disclosure, a method comprises forming a first plurality of metal posts and a second plurality of metal posts over a carrier, wherein the second plurality of metal posts are larger than the first plurality of metal posts, and wherein the second plurality of metal posts comprise a first portion aligned to a straight line; placing a device die over the carrier; encapsulating the device die, the first plurality of metal posts, and the second plurality of metal posts in an encapsulant; and forming a first plurality of redistribution lines over and electrically coupling to the first plurality of metal posts. In an embodiment, the second plurality of metal posts are aligned to a ring fully encircling the first plurality of metal posts. In an embodiment, the method further comprises, before the first plurality of redistribution lines are formed, planarizing the encapsulant to reveal the first plurality of metal posts, the second plurality of metal posts, and the device die. In an embodiment, the method further comprises ng forming a second plurality of redistribution lines electrically coupling to the first plurality of redistribution lines through the first plurality of metal posts. In an embodiment, some of the second plurality of redistribution lines are electrically coupled to the first plurality of redistribution lines through the second plurality of metal posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a device die;
   an encapsulant encapsulating the device die therein;
   a first plurality of through-vias penetrating through the encapsulant, wherein the first plurality of through-vias comprise a first array and a second array;
   a second plurality of through-vias penetrating through the encapsulant, wherein the second plurality of through-vias are outside of the first array, and wherein the second plurality of through-vias are larger than the first plurality of through-vias;
   a third plurality of through-vias penetrating through the encapsulant, wherein the third plurality of through-vias separate the first array from the second array, and the third plurality of through-vias are larger than the first plurality of through-vias; and
   redistribution lines over and electrically coupling to the first plurality of through-vias, wherein the second plurality of through-vias comprise active through-vias electrically coupling to the redistribution lines.

2. The package of claim 1 further comprising dummy through-vias outside of the first array and penetrating through the encapsulant.

3. The package of claim 2, wherein the dummy through-vias have a same size and a same shape as the first plurality of through-vias.

4. The package of claim 1, wherein the second plurality of through-vias are aligned to a straight line parallel to a row direction or a column direction of the first array.

5. The package of claim 1 further comprising a plurality of dummy through-vias separating the first array from the second array.

6. The package of claim 1, wherein the first plurality of through-vias are rounded with each having a first diameter, and the second plurality of through-vias are rounded with each having a second diameter greater than the first diameter.

7. The package of claim 1, wherein the first plurality of through-vias are rounded with each having a diameter, and wherein the second plurality of through-vias are elongated with each having a width equal to or greater than the diameter, and a length greater than the width.

8. The package of claim 1, wherein each of the first plurality of through-vias, the second plurality of through-vias, and the third plurality of through-vias comprises vertical and straight edges.

9. A package comprising:
   a molding compound;
   a device die molded in the molding compound;
   a plurality of through-vias molded in the molding compound, wherein each of the plurality of through-vias has a first lateral size;
   a first plurality of enlarged through-vias molded in the molding compound, wherein each of the first plurality of enlarged through-vias have a second lateral size greater than the first lateral size;
   redistribution lines over and electrically coupling to both of the plurality of through-vias and the first plurality of enlarged through-vias; and
   a second plurality of enlarged through-vias molded in the molding compound, wherein the second plurality of enlarged through-vias separate the plurality of through-vias into two arrays.

10. The package of claim 9, wherein the plurality of through-vias are rounded with each having a first diameter, and the first plurality of enlarged through-vias are rounded with each having a second diameter greater than the first diameter.

11. The package of claim 9, wherein the plurality of through-vias are rounded with each having a diameter, and wherein the first plurality of enlarged through-vias are elongated with each having a width equal to or greater than the diameter, and a length greater than the width.

12. The package of claim 11, wherein the first plurality of enlarged through-vias have lengthwise directions pointing from the plurality of through-vias outwardly.

13. The package of claim 9 further comprising dummy through-vias aligned to a same straight line with some portions of the first plurality of enlarged through-vias, wherein the dummy through-vias are electrically floating, and are molded in the molding compound.

14. A package comprising:
  a plurality of corners;
  a plurality of edges; and
  a plurality of metal posts comprising:
    a plurality of corner metal posts adjacent to the plurality of corners of the package;
    a plurality of edge metal posts aligned as rows and columns, wherein each of the rows and the columns is adjacent to and parallel to one of the plurality of edges of the package; and
    a plurality of inner metal posts separated from the plurality of corners and the plurality of edges of the package by the plurality of corner metal posts and the plurality of edge metal posts, respectively, wherein the plurality of corner metal posts and the plurality of edge metal posts are more elongated than the plurality of inner metal posts in a top-view of the package, with each of the plurality of inner metal posts having a first length-to-width ratio, each of the corner metal posts having a second length-to-width ratio greater than the first length-to-width ratio, and each of the edge metal posts having a third length-to-width ratio greater than the first length-to-width ratio, and wherein lengths and widths of the plurality of inner metal posts, the plurality of corner metal posts, and the plurality of edge metal posts are viewed in the top-view of the package, and wherein top surfaces of the plurality of corner metal posts, the plurality of edge metal posts, and the plurality of inner metal posts are coplanar with each other, and wherein bottom surfaces of the plurality of corner metal posts, the plurality of edge metal posts, and the plurality of inner metal posts are coplanar with each other, and wherein the plurality of inner metal posts form a first array and a second array; and
    a plurality of enlarged metal posts larger in the top-view of the package than the plurality of inner metal posts, wherein the plurality of enlarged metal posts separate the first array from the second array.

15. The package of claim 14, wherein the plurality of inner metal posts are non-elongated in the top-view of the package.

16. The package of claim 14, wherein the plurality of edge metal posts have lengthwise directions perpendicular to respective edges in the plurality of edges.

17. The package of claim 14, wherein the plurality of corner metal posts and the plurality of edge metal posts have first top-view areas greater than second top-view areas of the plurality of inner metal posts.

18. The package of claim 14 further comprising:
  a device die; and
  a molding compound molding the device die and the plurality of metal posts therein, wherein the plurality of metal posts penetrate through the molding compound, and wherein the bottom surfaces of the plurality of corner metal posts, the plurality of edge metal posts, and the plurality of inner metal posts are further coplanar with a bottom surface of the molding compound.

19. The package of claim 18, wherein both of the plurality of corner metal posts and the plurality of edge metal posts are arranged aligning to a ring encircling an entirety of the device die.

20. The package of claim 14, wherein each of the plurality of corner metal posts, the plurality of edge metal posts, and the plurality of inner metal posts comprises vertical and straight edges.

* * * * *